United States Patent
Park et al.

(10) Patent No.: US 11,404,126 B2
(45) Date of Patent: Aug. 2, 2022

(54) PAGE BUFFER AND SEMICONDUCTOR MEMORY DEVICE HAVING THE PAGE BUFFER

(71) Applicant: SK hynix Inc., Icheon-si (KR)

(72) Inventors: Kang Woo Park, Icheon-si (KR); Soo Yeol Chai, Icheon-si (KR)

(73) Assignee: SK hynix Inc., Icheon-si (KR)

(*) Notice: Subject to any disclaimer, the term of this patent is extended or adjusted under 35 U.S.C. 154(b) by 8 days.

(21) Appl. No.: 16/990,805

(22) Filed: Aug. 11, 2020

(65) Prior Publication Data

US 2021/0295927 A1 Sep. 23, 2021

(30) Foreign Application Priority Data

Mar. 17, 2020 (KR) .................. 10-2020-0032792

(51) Int. Cl.
*G11C 16/24* (2006.01)
*G11C 11/56* (2006.01)
(Continued)

(52) U.S. Cl.
CPC .......... *G11C 16/24* (2013.01); *G11C 11/5642* (2013.01); *G11C 11/5671* (2013.01);
(Continued)

(58) Field of Classification Search
CPC . G11C 16/24; G11C 11/5642; G11C 11/5671; G11C 16/0483; G11C 16/08;
(Continued)

(56) References Cited

U.S. PATENT DOCUMENTS 8,081,522 B2 * 12/2011 Murakami ............. G11C 16/04
365/189.05
8,743,623 B2 * 6/2014 Cho ....................... G11C 16/26
365/185.25
(Continued)

FOREIGN PATENT DOCUMENTS

KR 101046805 B1 7/2011
KR 1020130034763 A 4/2013

OTHER PUBLICATIONS

A 4b/cell 3D NAND Flash Memory with 23MB/s Program and 480MB/s Read High Throughput Performance and Improved Reliability, ISSCC 2019.

*Primary Examiner* — Tri M Hoang
(74) *Attorney, Agent, or Firm* — William Park & Associates Ltd.

(57) ABSTRACT

The present technology relates to a page buffer and a semiconductor memory device including the page buffer. The page buffer includes a first latch circuit configured to store data corresponding to one of a first program state and a second program state, a bit line controller connected to a bit line of a memory block and precharging the bit line by applying one of a first set voltage and a second set voltage to the bit line according to the data stored in the first latch circuit during a bit line precharge operation in a program verify operation, and a second latch circuit connected to the bit line controller through a main sensing node and configured to sense first verify data according to a potential level of the main sensing node during the program verify operation.

14 Claims, 18 Drawing Sheets

(51) Int. Cl.
*G11C 16/04* (2006.01)
*G11C 16/08* (2006.01)
*G11C 16/26* (2006.01)
*G11C 16/34* (2006.01)

(52) U.S. Cl.
CPC .......... *G11C 16/0483* (2013.01); *G11C 16/08* (2013.01); *G11C 16/26* (2013.01); *G11C 16/3459* (2013.01)

(58) Field of Classification Search
CPC ................ G11C 16/26; G11C 16/3459; G11C 2211/5621; G11C 2211/5642; G11C 16/10; G11C 16/30
See application file for complete search history.

(56) References Cited

U.S. PATENT DOCUMENTS

| | | | |
|---|---|---|---|
| 10,325,658 B2 * | 6/2019 | Lee | G11C 16/26 |
| 10,497,453 B2 * | 12/2019 | Bang | G11C 11/5642 |
| 10,559,362 B2 * | 2/2020 | Shin | G11C 16/10 |

* cited by examiner

PAGE BUFFER AND SEMICONDUCTOR MEMORY DEVICE HAVING THE PAGE BUFFER

CROSS-REFERENCE TO RELATED APPLICATION

The present application claims priority under 35 U.S.C. § 119(a) to Korean patent application number 10-2020-0032792, filed on Mar. 17, 2020, in the Korean Intellectual Property Office, the entire disclosure of which is incorporated herein by reference.

BACKGROUND

1. Technical Field

The present disclosure relates to an electronic device, and more particularly, to a page buffer and a semiconductor memory device including the same.

2. Related Art

Recently, a paradigm for a computer environment has been transformed into ubiquitous computing, which enables a computer system to be used whenever and wherever. Therefore, a use of a portable electronic device such as a mobile phone, a digital camera, and a notebook computer is rapidly increasing. Such a portable electronic device generally uses a memory system that uses a semiconductor memory device, that is, a data storage device. The data storage device is used as a main storage device or an auxiliary storage device of the portable electronic device.

The data storage device using the semiconductor memory device has advantages that stability and durability are excellent because there is no mechanical driver, an access speed of information is very fast, and power consumption is low. As an example of the memory system having such advantages, a data storage device includes a universal serial bus (USB) memory device, a memory card having various interfaces, a solid state drive (SSD), and the like.

A semiconductor memory device is largely divided into a volatile memory device and a non-volatile memory device.

A writing speed and a reading speed of the non-volatile memory device are relatively slow, however, the non-volatile memory device maintains storage data even though power supply is shut off. Therefore, a non-volatile memory device is used to store data to be maintained regardless of power supply. A non-volatile memory device includes a read only memory (ROM), a mask ROM (MROM), a programmable ROM (PROM), an erasable programmable ROM (EPROM), an electrically erasable programmable ROM (EEPROM), a flash memory, a phase change random access memory (PRAM), a magnetic RAM (MRAM), a resistive RAM (RRAM), a ferroelectric RAM (FRAM), and the like. The flash memory is divided into a NOR type and a NAND type.

SUMMARY

A page buffer according to an embodiment of the present disclosure may include a first latch circuit configured to store data corresponding to one of a first program state and a second program state, a bit line controller connected to a bit line of a memory block and configured to precharge the bit line by applying one of a first set voltage and a second set voltage to the bit line according to the data stored in the first latch circuit during a bit line precharge operation in a program verify operation, and a second latch circuit connected to the bit line controller through a main sensing node and configured to sense first verify data according to a potential level of the main sensing node during the program verify operation.

A page buffer according to an embodiment of the present disclosure may include a bit line controller connected to a bit line of a memory block, configured to precharge the bit line during a bit line precharge operation during a program verify operation corresponding to a first program state and a second program state, and configured to control a potential level of a main sensing node and a sub sensing node according to a current amount of the bit line during an evaluation operation in the program verify operation, a sensing node connection component connected between the main sensing node and the sub sensing node, configured to electrically connect the main sensing node and the sub sensing node to each other during a first period in the evaluation operation, and configured to electrically disconnect the main sensing node and the sub sensing node from each other during a second period after the first period, a first latch circuit connected to the main sensing node and configured to sense first verify data according to a potential level of the main sensing node during the program verify operation, and a second latch circuit connected to the sub sensing node and configured to sense second verify data according to a potential level of the sub sensing node during the program verify operation.

A semiconductor memory device according to an embodiment of the present disclosure includes a memory block may include a plurality of memory cells programmed to a plurality of program states, a voltage generation circuit configured to generate a program voltage and a plurality of verify voltages, an address decoder configured to apply the program voltage to a selected word line among word lines of the memory block during a program voltage apply operation, and configured to sequentially apply the plurality of verify voltages to the selected word line during a program verify operation, and page buffers respectively connected to bit lines of the memory block, and each of the page buffers configured to simultaneously verify at least two program states of the plurality of program states when one of the plurality of verify voltages is applied.

DETAILED DESCRIPTION

Specific structural or functional descriptions of embodiments according to the concepts which are disclosed in the present specification or application are illustrated only to describe the embodiments according to the concepts of the present disclosure. The embodiments according to the concepts of the present disclosure may be carried out in various forms and the descriptions are not limited to the embodiments described in the present specification or application.

Hereinafter, embodiments of the present disclosure will be described with reference to the accompanying drawings, so that those skilled in the art to which the present disclosure pertains may carry out the technical spirit of the present disclosure.

An embodiment of the present disclosure provides a page buffer capable of reducing a program verification time and a semiconductor memory device including the page buffer.

According to an embodiment, at least two program states may be verified together during the program verify operation to reduce a program verify operation time.

Figure 1:
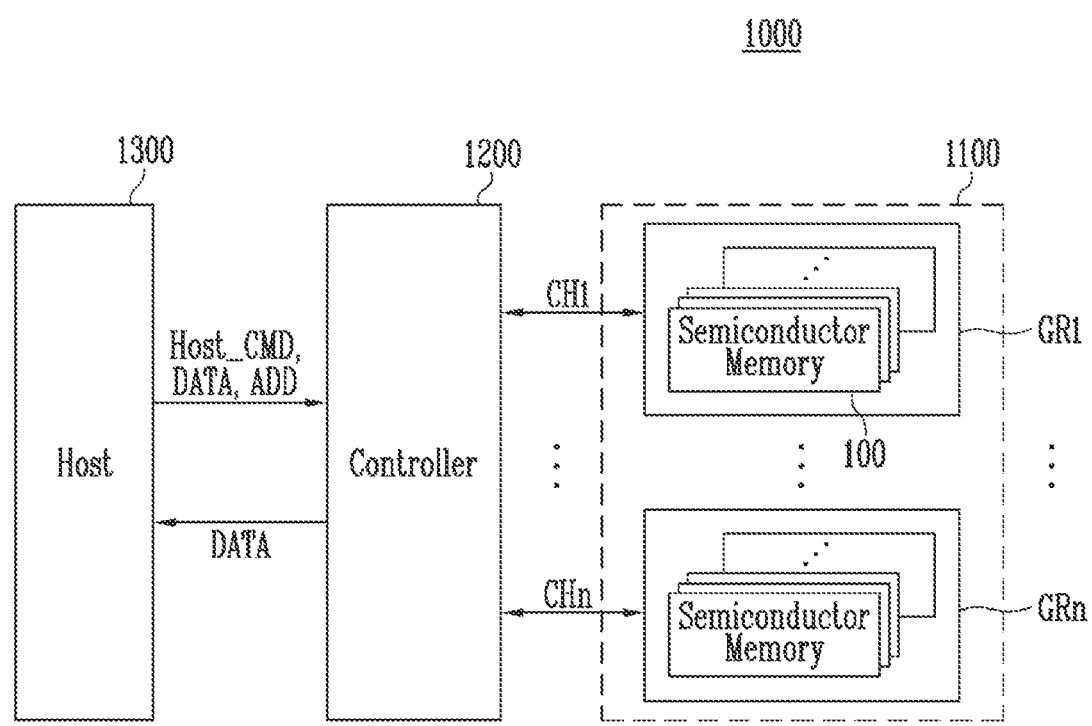
FIG. 1 is a block diagram for describing a memory system including a memory device according to an embodiment of the present disclosure.

FIG. 1 is a block diagram for describing a memory system including a semiconductor memory device according to an embodiment of the present disclosure.

Referring to FIG. 1, the memory system 1000 includes a memory device 1100, a controller 1200, and a host 1300. The memory device 1100 includes a plurality of semiconductor memory devices 100. The plurality of semiconductor memory devices 100 may be divided into a plurality of groups. Although the host 1300 is illustrated and described as being included in the memory system 1000 in an embodiment of the present disclosure, the memory system 1000 may be configured to include only the controller 1200 and the memory device 1100, and the host may be configured to be disposed outside the memory system 1000.

In FIG. 1, the plurality of groups GR1 to GRn of the memory device 1100 communicate with the controller 1200 through first to n-th channels CH1 to CHn, respectively. Each semiconductor memory device 100 will be described later with reference to FIG. 2.

Each of the groups GR1 to GRn is configured to communicate with the controller 1200 through one common channel. The controller 1200 is configured to control the plurality of semiconductor memories 100 of the memory device 1100 through the plurality of channels CH1 to CHn.

In an embodiment of the present disclosure, the plurality of semiconductor memory devices 100 included in the memory device 1100 perform a multi-verify operation of verifying two or more adjacent program states together using a one verify voltage during a program verify operation. Therefore, a program verify operation time may be improved.

The controller 1200 is connected between the host 1300 and the memory device 1100. The controller 1200 is configured to access the memory device 1100 in response to a request from the host 1300. For example, the controller 1200 is configured to control read, program, erase, and background operations of the memory device 1100 in response to a host command Host_CMD received from the host 1300. During the program operation, the host 1300 may transmit an address ADD and data DATA to be programmed together with the host command Host_CMD, and during the read operation, the host 1300 may transmit the address ADD together with the host command Host_CMD. During the program operation, the controller 1200 transmits a command corresponding to the program operation and the data DATA to be programmed to the memory device 1100. During the read operation, the controller 1200 transmits a command corresponding to the read operation to the memory device 1100, receives the read data DATA from the memory device 1100, and transmits the received data DATA to the host 1300. The controller 1200 is configured to provide an interface between the memory device 1100 and the host 1300. The controller 1200 is configured to drive firmware for controlling the memory device 1100.

The host 1300 includes a portable electronic device such as a computer, a PDA, a PMP, an MP3 player, a camera, a camcorder, or a mobile phone. The host 1300 may request a program operation, a read operation, an erase operation, or the like of the memory system 1000 through the host command Host_CMD. The host 1300 may transmit the host command Host_CMD, the data DATA, and the address ADD corresponding to the program operation to the controller 1200 for the program operation of the memory device 1100 and may transmit the host command Host_CMD and the address ADD corresponding to the read operation for the read operation to the controller 1200. At this time, the address ADD may be a logical address (logical address block) of data.

The controller 1200 and the memory device 1100 may be integrated into one semiconductor memory device. For an embodiment, the controller 1200 and the memory device 1100 may be integrated into a one semiconductor memory device to configure a memory card. For example, the controller 1200 and the memory device 1100 may be integrated into a one semiconductor memory device to configure a memory card such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash stage device (UFS).

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

In an embodiment, the memory device 1100 or memory system 1000 may be mounted as a package of various types. For example, the memory device 1100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline (SOIC), a shrink small outline package (SSOP), a thin small outline (TSOP), a system in package (SIP), a multi-chip package (MCP), a wafer-level fabricated package (WFP), or a wafer-level processed stack package (WSP).

Figure 2:
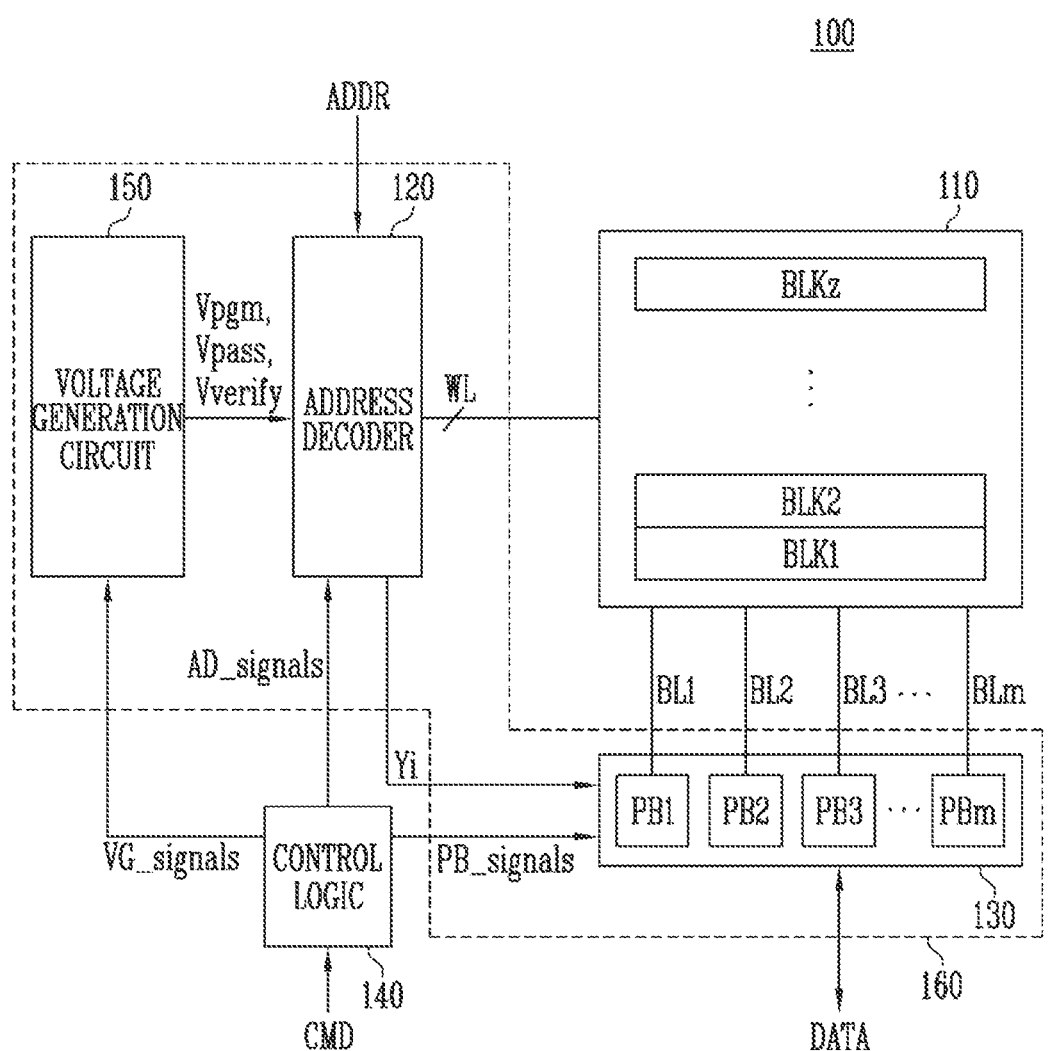
FIG. 2 is a diagram for describing a semiconductor memory device included in the memory device of FIG. 1.

FIG. 2 is a diagram for describing the semiconductor memory device included in the memory device of FIG. 1.

The semiconductor memory device 100 according to an embodiment of the present disclosure may perform a program voltage apply operation and a program verify operation on memory cells connected to a selected word line when receiving a command CMD corresponding to the program operation from the controller 1200 of FIG. 1. During the program verify operation, the semiconductor memory device 100 may verify at least two program states together in a state in which one verify voltage is applied to the selected word line.

Referring to FIG. 2, the semiconductor memory device 100 includes a memory cell array 110, an address decoder 120, a read and write circuit 130, control logic 140, and a voltage generation circuit 150. The address decoder 120, the read and write circuit 130, and the voltage generation circuit 150 may be defined as a peripheral circuit 160 that performs a read operation on the memory cell array 110. The control logic 140 may be implemented as hardware, software, or a combination of hardware and software. For example, the control logic 140 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. As an embodiment, the plurality of memory cells are non-volatile memory cells. A plurality of memory cells connected to one word line among the plurality of memory cells may be defined as one page. That is, the memory cell array 110 may be configured of a plurality of pages.

Each of the plurality of memory blocks BLK1 to BLKz of the memory cell array 110 includes a plurality of memory strings. Each of the plurality of memory strings includes a drain select transistor connected in series between a bit line and a source line, a plurality of memory cells, and a source select transistor. In addition, each of the plurality of memory strings may include a pass transistor between the source select transistor and the memory cells, and between the drain select transistor and the memory cells, and may further include a pipe gate transistor between the memory cells. A description of the memory cell array 110 will be described later.

The address decoder 120 is connected to the memory cell array 110 through the word lines WL. The address decoder 120 is configured to operate in response to address decoder control signals AD_signals generated in the control logic 140. The address decoder 120 receives an address ADDR through an input/output buffer (not shown) inside the memory device 100.

During the program operation, the address decoder 120 may decode a row address of the received address ADDR and may apply a plurality of operation voltages including a program voltage Vpgm, a pass voltage Vpass, and a plurality of verify voltages Vverify generated by the voltage generation circuit 150 to the plurality of memory cells of the memory cell array 110 according to the decoded row address.

The address decoder 120 is configured to decode a column address of the received address ADDR. The address decoder 120 transmits a decoded column address Yi to the read and write circuit 130.

The address ADDR received during the program operation includes a block address, the row address, and the column address. The address decoder 120 selects one memory block and one word line according to the block address and the row address. The column address is decoded by the address decoder 120 and provided to the read and write circuit 130.

The address decoder 120 may include a block decoder, a row decoder, a column decoder, an address buffer, and the like.

The read and write circuit 130 includes a plurality of page buffers PB1 to PBm. The plurality of page buffers PB1 to PBm are connected to the memory cell array 110 through the bit lines BL1 to BLm. Each of the plurality of page buffers PB1 to PBm temporarily stores the data DATA to be programmed, which is received from the controller 1200 of FIG. 1 before the program voltage apply operation. In addition, each of the plurality of page buffers PB1 to PBm controls a potential level of the bit lines BL1 to BLm according to the temporarily stored data DATA during the program voltage apply operation. In addition, each of the plurality of page buffers PB1 to PBm precharges a corresponding bit line to a setting level according to the temporarily stored data during the program verify operation, and performs the program verify operation by sensing a cell current of the bit line. In addition, each of the plurality of page buffers PB1 to PBm sets a bit line evaluation time according to the temporarily stored data during the program verify operation, and performs the program verify operation by evaluating the bit line and a sensing node in the page buffer during the set evaluation time. A description of the plurality of page buffers PB1 to PBm will be described later.

The read and write circuit 130 operates in response to page buffer control signals PB_signals output from the control logic 140.

In an embodiment, the read and write circuit 130 may include the page buffers (or page registers), a column select circuit, and the like.

The control logic 140 is connected to the address decoder 120, the read and write circuit 130, and the voltage generation circuit 150. The control logic 140 receives a command CMD through the input/output buffer (not shown) of the semiconductor memory device 100. The control logic 140 is configured to control an overall operation of the semiconductor memory device 100 in response to the command CMD. For example, the control logic 140 receives the command CMD corresponding to the program operation, and generates and outputs address decoder control signals AD_signals for controlling the address decoder 120. page buffer control signals PB_signals for controlling the read and write circuit 130, voltage generation circuit control signals VG_signals for controlling the voltage generation circuit 150, in response to the received command CMD.

During the program operation, the voltage generation circuit 150 generates the program voltage Vpgm, the pass voltage Vpass, and the plurality of verify voltages Vverify according to control of the voltage generation circuit control signals VG_signals output from the control logic 140, and outputs the program voltage Vpgm, the pass voltage Vpass, and the plurality of verify voltages Vverify to the address decoder 120.

Figure 3:
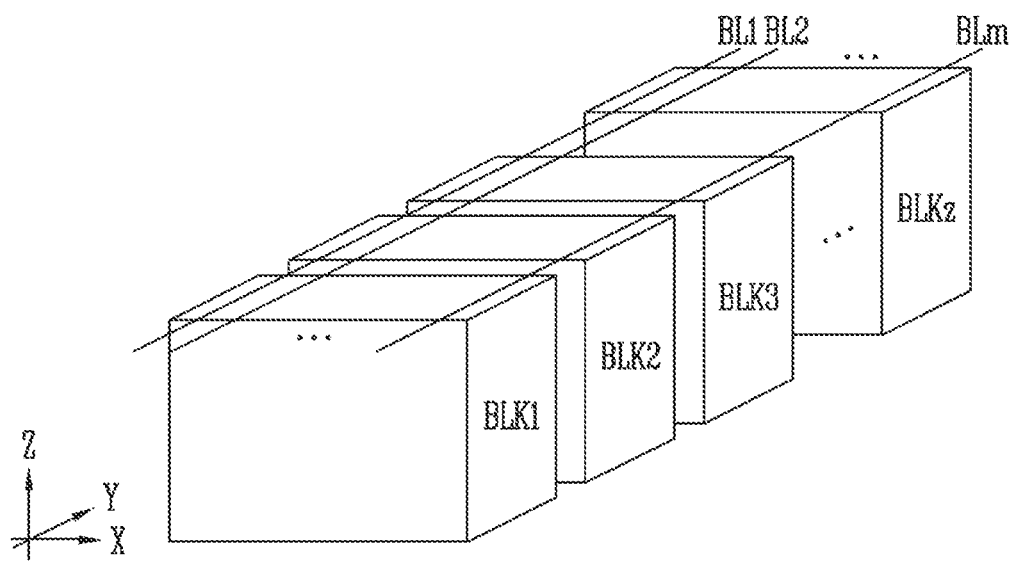
FIG. 3 is a diagram for describing three-dimensional memory blocks.

FIG. 3 is a diagram for describing three-dimensional memory blocks.

Referring to FIG. 3, the three-dimensional memory blocks BLK1 to BLKz may be arranged to be spaced apart from each other along a direction Y in which the bit lines BL1 to BLM are extended. For example, first to z-th memory blocks BLK1 to BLKz may be arranged to be spaced apart from each other along a second direction Y, and include a plurality of memory cells stacked along a third direction Z. A configuration of any one of the first to z-th memory blocks BLK1 to BLKz will be specifically described below with reference to FIGS. 4 and 5.

Figure 4:
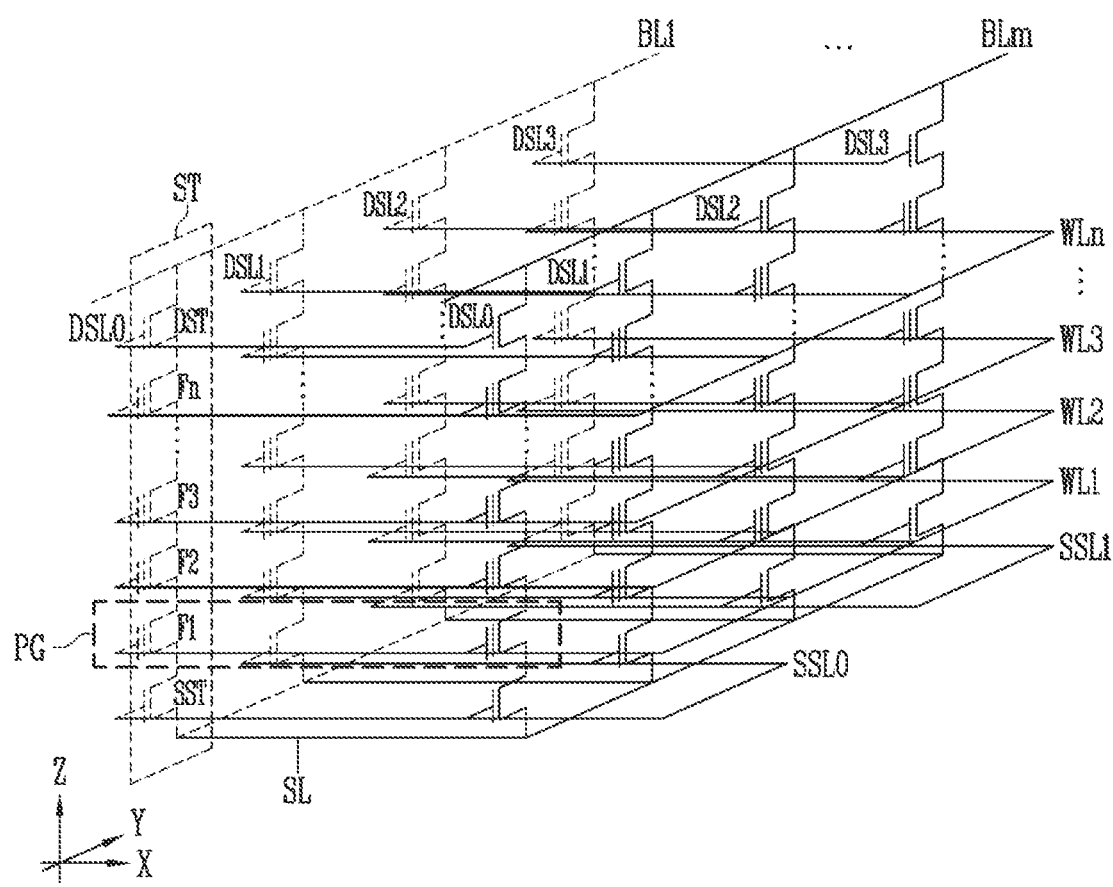
FIG. 4 is a circuit diagram for specifically describing one of the memory blocks shown in FIG. 3.

FIG. 4 is a circuit diagram for specifically describing one of the memory blocks shown in FIG. 3.

Figure 5:
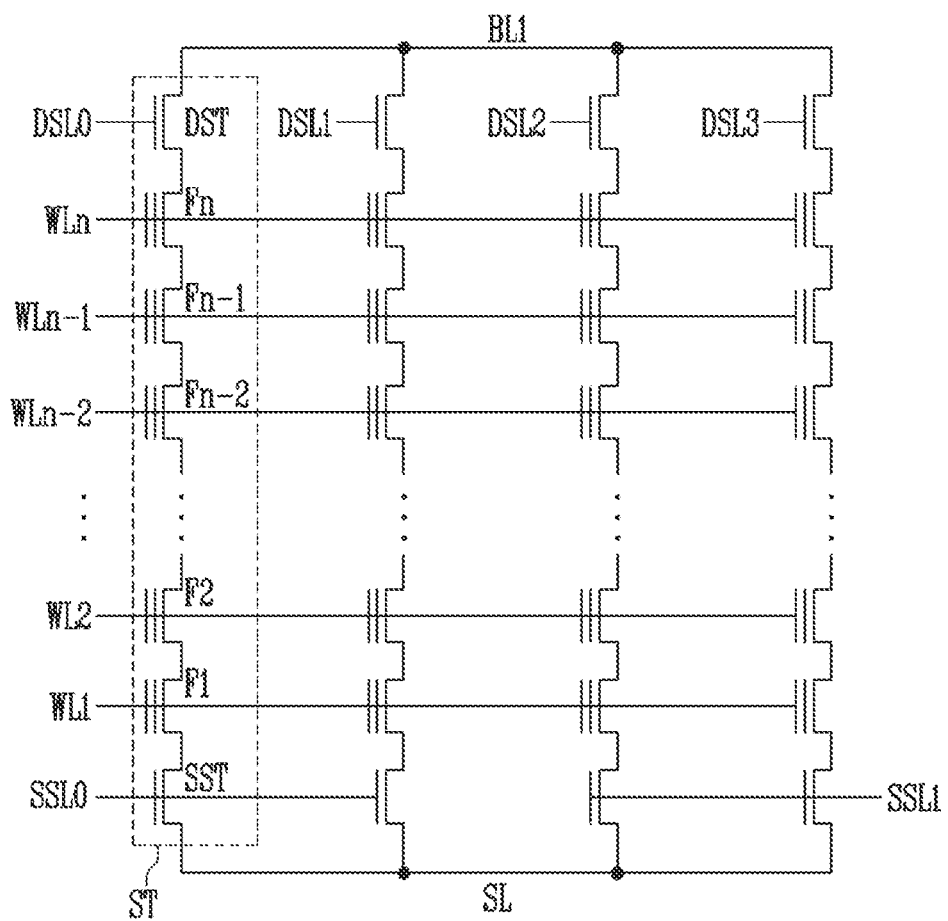
FIG. 5 is a circuit diagram for describing memory strings shown in FIG. 4.

FIG. 5 is a circuit diagram for describing memory strings shown in FIG. 4.

Referring to FIGS. 4 and 5, each memory string ST may be connected between the bit lines BL1 to BLm and a source line SL. The memory string ST connected between the first bit line BL1 and the source line SL will be described as an example.

The memory string ST may include source select transistors SST connected in series between the source line SL and the first bit line BL1, memory cells F1 to Fn (n is a positive integer), and a drain select transistor DST. Gates of the source select transistors SST included in different memory strings ST connected to different bit lines BL1 to BLm may be connected to a first source select line SSL0 and a second source select line SSL1. For example, source select transistors adjacent to each other in the second direction Y among the source select transistors SST may be connected to the same source select line. For example, assuming that the source select transistors SST are sequentially arranged along the second direction Y, the gates of the source select transistors SST arranged in the first direction X from a first source select transistor SST and included in different strings ST and the gates of the source select transistors SST arranged in the first direction X from a second source select transistor SST and included in different strings ST may be connected to the first source select line SSL©. In addition, the gates of the source select transistors SST arranged in the first direction X from a third source select transistor SST and included in different strings ST and the gates of the source select transistors SST arranged in the first direction X from a fourth source select transistor SST and included in different strings ST may be connected to the second source select line SSL1.

Gates of the memory cells F1 to Fn may be connected to the word lines WL1 to WLn, and gates of the drain select transistors DST may be connected to any one of first to fourth drain select lines DSL0 to DSL3.

Gates of transistors arranged in the first direction X among the drain select transistors DST may be commonly connected to the same drain select line (for example, DSL0), but transistors arranged in the second direction Y may be connected to different drain select lines DSL1 to DSL3. For example, assuming that the drain select transistors DST are sequentially arranged along the second direction Y, the gates of the drain select transistors DST arranged in the first direction X from a first drain select transistor DST and included in different strings ST may be connected to a first drain select line DSL0. The drain select transistors DST arranged in the second direction Y from the drain select transistors DST connected to the first drain select line DSL0 may be sequentially connected to second to fourth drain select lines DSL1 to DSL3, Therefore, the memory strings ST connected to a selected drain select line may be selected within a selected memory block, and memory strings ST connected to remaining unselected drain select lines may be unselected.

Memory cells connected to the same word line may form one page PG. Here, the page means a physical page. For example, among the strings ST connected to the first bit line BL1 to the m-th bit line BLm, a group of memory cells connected in the first direction X at the same word line is referred to as the page PG. For example, among the first memory cells F1 connected to the first word line WL1, memory cells arranged along the first direction X may form one page PG. Cells arranged in the second direction Y among the first memory cells F1 commonly connected to the first word line WL1 may be divided into different pages. Therefore, when the first drain select line DSL0 is the selected drain select line and the first word line WL1 is the selected word line, the page connected to the first drain select line DSL0 becomes a selected page among a plurality of pages PG connected to the first word line WL1. The pages which is commonly connected to the first word line WL1 but connected to the unselected second to fourth drain select lines DSL1 to DSL3 become unselected pages.

In the drawing, one source select transistor SST and one drain select transistor DST are included in one string ST, but a plurality of source select transistors SST and a plurality of drain select transistors DST may be included in one string ST according to the semiconductor memory device. In addition, dummy cells may be included between the source select transistor SST, the memory cells F1 to Fn, and the drain select transistor DST according to the memory device. The dummy cells may not store user data like normal memory cells F1 to Fn, but may be used to improve an electrical characteristic of each string ST. However, the dummy cells are not an important configuration in the present embodiment, and thus detailed description thereof is omitted.

Figure 6:
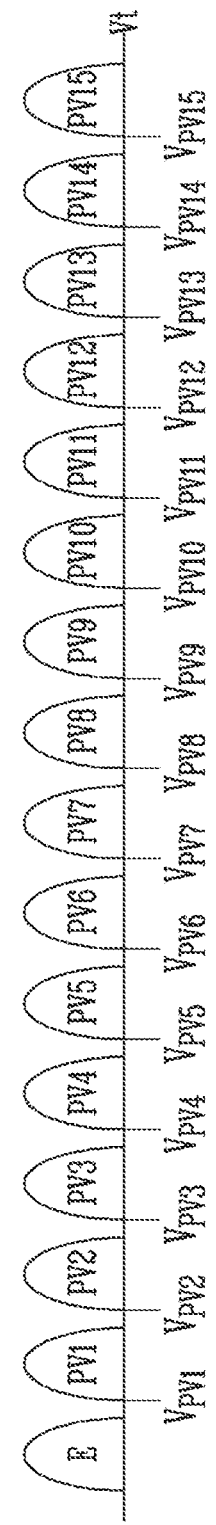
FIG. 6 is a threshold voltage distribution diagram for describing an erase state and a plurality of program states of the memory cells.

FIG. 6 is a threshold voltage distribution diagram for describing the erase state and the plurality of program states of the memory cells.

Each of the memory cells may be a single level cell (SLC) that stores one data bit, a multi-level cell (MLC) that stores two data bits, a triple level cell (TLC) that stores three data bits, or a quad level cell (QLC) capable of storing four data bits. In an embodiment of the present disclosure, the program operation of the QLC will be described as an example.

The program operation may be performed on the plurality of memory cells included in one page, and thus the plurality of memory cells may be programmed to have threshold voltages corresponding to the erase state E and the plurality of program states PV1 to PV15. The erase state E and the plurality of program states PV1 to PV15 may be distinguished from adjacent program states by a plurality of verify voltages $V_{PV1}$ to $V_{PV15}$. For example, the threshold voltage distribution of the memory cells corresponding to the first program state PV1 is equal to or higher than the verify voltage $V_{PV1}$ and lower than the verify voltage $V_{PV2}$, and the threshold voltage distribution of the memory cells corresponding to the second program state PV2 is equal to or higher than the verify voltage $V_{PV2}$ and lower than the verify voltage $V_{PV3}$.

Figure 7:
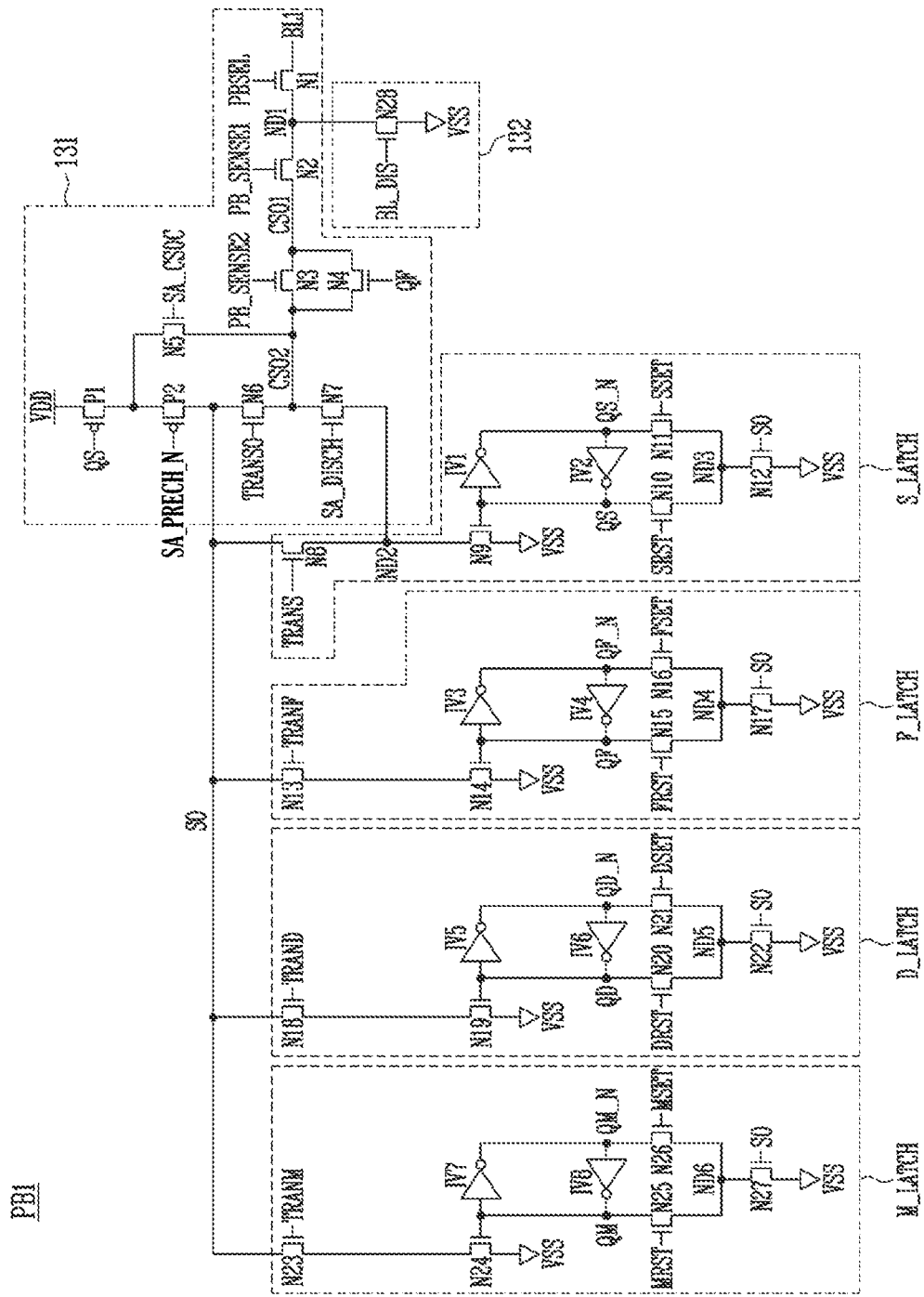
FIG. 7 is a diagram for describing a page buffer according to an embodiment of the present disclosure.

FIG. 7 is a diagram for describing the page buffer according to an embodiment of the present disclosure.

The plurality of page buffers PB1 to PBm shown in FIG. 2 may be configured in a structure similar to each other, and in an embodiment of the present disclosure, a structure of the page buffer PB1 will be described as an example.

The page buffer PB1 may include a bit line controller 131, a bit line discharger 132, and a plurality of latch circuits S_LATCH, F_LATCH, D_LATCH, and M_LATCH.

During the program voltage apply operation of the program operation, the bit line controller 131 controls a potential level of the corresponding bit line BL1 to a program inhibit voltage (for example, VDD) or a program permit voltage (for example, VSS). During the program verify operation of the program operation, the bit line controller 131 precharges the potential level of the corresponding bit line BL1 to a first setting level or a second setting level according to data stored in the latch circuit F_LATCH. The first setting level and the second setting level are potential levels higher than a ground power VSS and lower than a power voltage VDD. Thereafter, during an evaluation period, the bit line controller 131 electrically connects the bit line BL1 and a main sensing node SO to each other to control a potential level of the main sensing node SO according to a current change amount of the bit line BL1.

The bit line controller 131 may include a plurality of NMOS transistors N1 to N7 and a plurality of PMOS transistors P1 and P2.

The NMOS transistor N1 is connected between the bit line BL1 and a node ND1, and is turned on in response to a page buffer select signal PBSEL to electrically connect the bit line BL1 and the node ND1 to each other.

The NMOS transistor N2 is connected between the node ND1 and a first common node CSO1, and is turned on in response to a first page buffer sensing signal PB_SENSE1 to electrically connect the node ND1 and the first common node CSO1 to each other.

The NMOS transistor N3 and the NMOS transistor N4 are connected in parallel between a second common node CSO2 and the first common node CSO1. The NMOS transistor N3 is turned on in response to a second page buffer sensing signal PB_SENSE2 to form a current path connecting the second common node CSO2 and the first common node CSO1 to each other, and the NMOS transistor N4 is turned on in response to a potential of a node QF of the latch circuit F_LATCH to form a current path connecting the second common node CSO2 and the first common node CSO1 to each other. A potential level when the second page buffer sensing signal PB_SENSE2 is a high level is lower than the potential level when the first page buffer sensing signal PB_SENSE1 is a high level. In addition, the potential level when the potential of the node QF is a high level is higher than the potential level when the second page buffer sensing signal PB_SENSE2 is a high level.

The PMOS transistor P1 and the PMOS transistor P2 are connected in series between a terminal of the power voltage VDD and the main sensing node SO, and are turned on in response to the node QS of the latch circuit S_LATCH and a precharge signal SA_PRECH_N, respectively.

The NMOS transistor N5 is connected between the second common node CSO2 and a node between the PMOS transistor P1 and the PMOS transistor P2, and is turned on in response to a control signal SA_CSOC to supply the power voltage VDD supplied through the PMOS transistor P1 to the second common node CSO2.

The NMOS transistor N6 is connected between the main sensing node SO and the second common node CSO2, and is turned on in response to a transmission signal TRANS© to electrically connect the main sensing node SO and the second common node CSO2 to each other.

The NMOS transistor N7 is connected between the second common node CSO2 and a node ND2 of the latch circuit S_LATCH, and is turned on in response to a discharge signal SA_DISCH to electrically connect the second common node CSO2 and the node ND2 to each other.

During a bit line precharge operation of the program verify operation, the bit line controller 131 may precharge the bit line BL1 to the first setting level or the second setting level higher than the first setting level according to the node QS and the node QF.

For example, when the potential level of the node QS and the node QF are at low levels, the PMOS transistor P1 is turned on in response to the potential level of the node QS, the NMOS transistor N5 is turned on in response to the control signal SA_CSOC, and thus the second common node CSO2 is charged to a VDD−Vth (a threshold voltage of NMOS transistor N5) level. The NMOS transistor N3 is turned on in response to the second page buffer sensing signal PB_SENSE2 to form the current path between the second common node CSO2 and the first common node CSO1, and the first common node CSO1 is charged to a level of the potential level of the second page buffer sensing signal PB_SENSE2 −Vth (a threshold voltage of NMOS transistor N3). In addition, the NMOS transistor N1 and the NMOS transistor N2 are turned on in response to the page buffer select signal PBSEL and the first page buffer sensing signal PB_SENSE1, respectively, and thus the potential level of the first common node CSO1 is transferred to the bit line BL1. At this time, since the potential level of the second page buffer sensing signal PB_SENSE2 is lower than the potential level of the first page buffer sensing signal PB_SENSE1, the potential level of the first common node CSO1 is transferred to the bit line BL1 without a clamping operation. Therefore, the bit line BL1 is precharged to a level (first setting level) of the potential level of the second page buffer sensing signal PB_SENSE2 −Vth (the threshold voltage of NMOS transistor N3).

On the other hand, when the potential level of the node QS is a low level and the potential level of the node QF is a high level, the PMOS transistor P1 is turned on in response to the potential level of the node QS, the NMOS transistor N5 is turned on in response to the control signal SA_CSOC, and thus the second common node CSO2 is charged to a level of VDD−Vth (the threshold voltage of NMOS transistor N5).

The NMOS transistor N3 is turned on in response to the second page buffer sensing signal PB_SENSE2 to form the current path between the second common node CSO2 and the first common node CSO1, and the NMOS transistor N4 is turned on in response to the potential level of the node QF to form the current path between the second common node CSO2 and the first common node CSO1. At this time, since the potential level of the node QF applied to a gate of the NMOS transistor N4 is higher than the potential level of the second page buffer sensing signal PB_SENSE2, the potential level of the second common node CSO2 is transferred to the first common node CSO1 without a clamping operation. Therefore, the first common node CSO1 is charged to a VDD−Vth (the threshold voltage of NMOS transistor N5) level. In addition, the NMOS transistor N1 and the NMOS transistor N2 are turned on in response to the page buffer select signal PBSEL and the first page buffer sensing signal PB_SENSE1, respectively, and thus the bit line BL1 is precharged. The clamping operation is generated by the NMOS transistor N2 and thus the bit line BL1 is precharged to a level (second setting level) of the potential level of the first page buffer sensing signal PB_SENSE1−Vth (a threshold voltage of NMOS transistor N2).

The bit line discharger 132 is connected to the node ND1 of the bit line controller 131 to discharge the potential level of the bit line BIL1

The bit line discharger 132 may include an NMOS transistor N28 connected between the node ND1 and a terminal of the ground power VSS, and the NMOS transistor N28 is turned on in response to a bit line discharge signal BL_DIS to electrically connect the node ND1 and the terminal of the ground power VSS.

The latch circuit S_LATCH may include a plurality of NMOS transistors N8 to N12 and inverters IV1 and IV2.

The inverters IV1 and IV2 are connected in parallel in a reverse direction between the node QS and a node QS_N.

The NMOS transistor N8 and the NMOS transistor N9 are connected in series between the main sensing node SO and the terminal of the ground power VSS, the NMOS transistor N8 is turned on in response to a transmission signal TRANS, and the NMOS transistor N9 is turned on or turned off according to the potential level of the node QS.

The NMOS transistor N10 is connected between the node QS and a node ND3, and is turned on in response to a reset signal SRST to electrically connect the node QS and the node ND3 to each other. The NMOS transistor N11 is connected between a node QS_N and the node ND3, and is turned on in response to a set signal SSET to electrically connect the node QS_N and the node ND3 to each other. The NMOS transistor N12 is connected between the node ND3 and the terminal of the ground power VSS, and is turned on according to the potential of the main sensing node SO to electrically connect the node ND3 and the terminal of the ground power VSS to each other. For example, in a state in which the main sensing node SO is precharged to a high level, when the reset signal SRST is applied to the NMOS transistor N10 as a high level, the node QS and the node QS_N are initialized to a low level (ground power level; 0) and a high level (power voltage level; 1), respectively. In addition, in a state in which the main sensing node SO is precharged to a high level, the set signal SSET is applied to the NMOS transistor N11 as a high level, the node QS and the node QS_N are set to a high level (1) and a low level (0), respectively.

The latch circuit F_LATCH may include a plurality of NMOS transistors N13 to N17 and inverters IV3 and IV4.

The inverters IV3 and IV4 are connected in parallel in a reverse direction between the node QF and a node QF_N.

The NMOS transistor N13 and the NMOS transistor N14 are connected in series between the main sensing node SO and the terminal of the ground power VSS, the NMOS transistor N13 is turned on in response to a transmission signal TRANF, and the NMOS transistor N14 is turned on or turned off according to the potential level of the node QF.

The NMOS transistor N15 is connected between the node QF and a node ND4, and is turned on in response to a reset signal FRST to electrically connect the node QF and the node ND4 to each other. The NMOS transistor N16 is connected between a node QF_N and the node ND4, and is turned on in response to a set signal FSET to electrically connect the node QF_N and the node ND4 to each other. The NMOS transistor N17 is connected between the node ND4 and the terminal of the ground power VSS, and is turned on according to the potential of the main sensing node SO to electrically connect the node ND4 and the terminal of the ground power VSS to each other. For example, in a state in which the main sensing node SO is precharged to a high level, when the reset signal FRST is applied to the NMOS transistor N15 as a high level, the node QF and the node QF_N are initialized to a low level (0) and a high level (1), respectively. In addition, in a state in which the main sensing node SO is precharged to a high level, the set signal FSET is applied to the NMOS transistor N17 as a high level, the node QF and the node QF_N are set to a high level (1) and a low level (0), respectively.

The latch circuit D_LATCH may include a plurality of NMOS transistors N18 to N22 and inverters IV5 and IV6.

The inverters IV5 and IV6 are connected in parallel in a reverse direction between a node QD and a node QD_N.

The NMOS transistor N18 and the NMOS transistor N19 are connected in series between the main sensing node SO and the terminal of the ground power VSS, the NMOS transistor N18 is turned on in response to a transmission signal TRAND, and the NMOS transistor N19 is turned on or turned off according to a potential level of the node QD.

The NMOS transistor N20 is connected between the node QD and a node ND5, and is turned on in response to a reset signal DRST to electrically connect the node QD and the node ND5 to each other. The NMOS transistor N21 is connected between the node QD_N and the node ND5, and is turned on in response to a set signal DSET to electrically connect the node QD_N and the node ND5 to each other. The NMOS transistor N22 is connected between the node ND5 and the terminal of the ground power VSS, and is turned on according to the potential of the main sensing node SO to electrically connect the node ND5 and the terminal of the ground power VSS to each other.

For example, when the NMOS transistor N21 is turned on by applying the set signal DSET of a high level during the program verify operation, the NMOS transistor N22 is turned on or turned off according to the potential level of the main sensing node SO, which is maintained or changed according to a current amount of the bit line BL1, and thus verify data may be stored in the latch circuit D_LATCH.

The latch circuit M_LATCH may include a plurality of NMOS transistors N23 to N27 and inverters IV7 and IV8.

The inverters IV7 and IV8 are connected in parallel in a reverse direction between a node QM and a node QM_N.

The NMOS transistor N23 and the NMOS transistor N24 are connected in series between the main sensing node SO and the terminal of the ground power VSS, the NMOS transistor N23 is turned on in response to a transmission signal TRANM, and the NMOS transistor N24 is turned on or turned off according to a potential level of the node QM.

The NMOS transistor N25 is connected between the node QM and a node ND6, and is turned on in response to a reset signal MRST to electrically connect the node QM and the node ND6 to each other. The NMOS transistor N26 is connected between the node QM_N and the node ND6, and is turned on in response to a set signal MSET to electrically connect the node QM_N and the node ND6 to each other. The NMOS transistor N27 is connected between the node ND6 and the terminal of the ground power VSS, and is turned on according to the potential of the main sensing node SO to electrically connect the node ND6 and the terminal of the ground power VSS to each other.

For example, when the NMOS transistor N26 is turned on by applying the set signal MSET of a high level during the program verify operation, the NMOS transistor N27 is turned on or turned off according to the potential level of the main sensing node SO, which is maintained or changed according to the current amount of the bit line BL1, and thus the verify data may be stored in the latch circuit M_LATCH.

Figure 8:
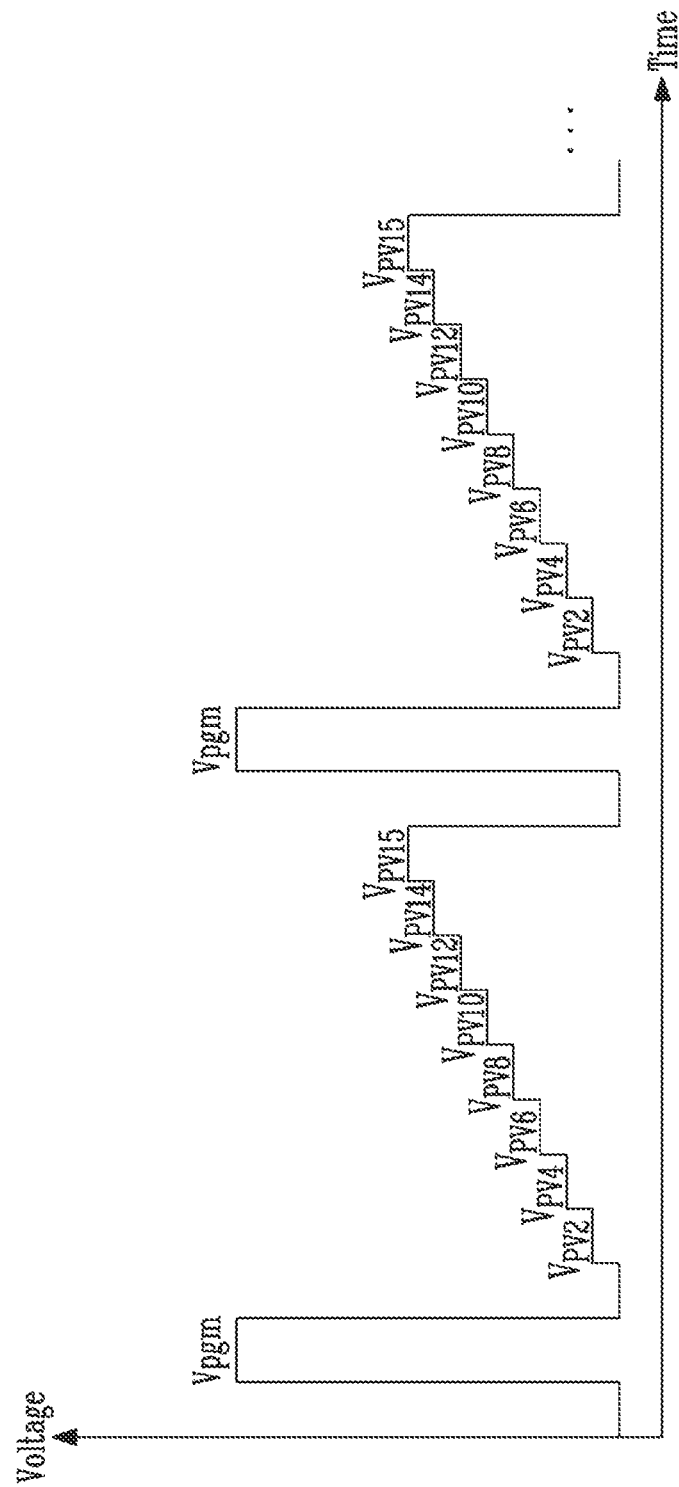
FIG. 8 is a voltage waveform diagram for describing a program voltage and a verify voltage for applying to a selected word line during a program operation according to the present disclosure.

FIG. 8 is a voltage waveform diagram for describing the program voltage and the verify voltage for applying to the selected word line during the program operation according to the present disclosure.

Referring to FIG. 8, during the program operation according to the present disclosure, the program voltage apply operation is performed by applying the program voltage Vpgm to the selected word line. At this time, the pass voltage is applied to unselected word lines.

Thereafter, the program verify operation on the plurality of program states (PV1 to PV15 of FIG. 6) is performed by sequentially applying a plurality of verify voltages $V_{PV2}$, $V_{PV4}$, $V_{PV6}$, $V_{PV8}$, $V_{PV10}$, $V_{PV12}$, $V_{PV14}$, and $V_{PV15}$ to the selected word line. During the program verify operation, the verify operation on at least two program states adjacent to each other may be simultaneously performed using one verify voltage. For example, the verify operation on the first program state PV1 and the second program state PV2 is performed together by applying the verify voltage $V_{PV2}$ to the selected word line. In addition, the verify operation on the third program state PV3 and the fourth program state PV4 is performed together by applying the verify voltage $V_{PV4}$ to the selected word line, and the verify operation on the fifth program state PV5 and the sixth program state PV6 is performed together by applying the verify voltage $V_{PV6}$ to the selected word line. In addition, the verify operation on the seventh program state PV7 and the eighth program state PV8 is performed together by applying the verify voltage $V_{PV8}$ to the selected word line, and the verify operation on the ninth program state PV9 and the tenth program state PV10 is performed together by applying the verify voltage $V_{PV10}$ to the selected word line. In addition, the verify operation on the eleventh program state PV11 and the twelfth program state PV12 is performed together by applying the verify voltage $V_{PV12}$ to the selected word line, and the verify operation on the thirteenth program state PV13 and the fourteenth program state PV14 is performed together by applying the verify voltage $V_{PV14}$ to the selected word line. Finally, the verify operation on the fifteenth program state PV15 is performed by applying the verify voltage $V_{PV15}$ to the selected word line.

When performing the verify operation on the plurality of program states together using one verify voltage, the page buffers PB1 to PBm of FIG. 2 may perform the program verify operation after precharging the corresponding bit line to the first setting level or the second setting level according to the data to be programmed, which is temporarily stored during the program operation. For example, when the verify operation for the first program state PV1 and the second program state PV2 is performed by applying the verify voltage $V_{PV2}$ to the selected word line, a page buffer storing data corresponding to the first program state PV1 may perform the program verify operation by precharging the corresponding bit line to the first setting level, and a page buffer storing data corresponding to the second program state PV2 may perform the program verify operation by precharging the corresponding bit line to the second setting level higher than the first setting level.

Figure 9:
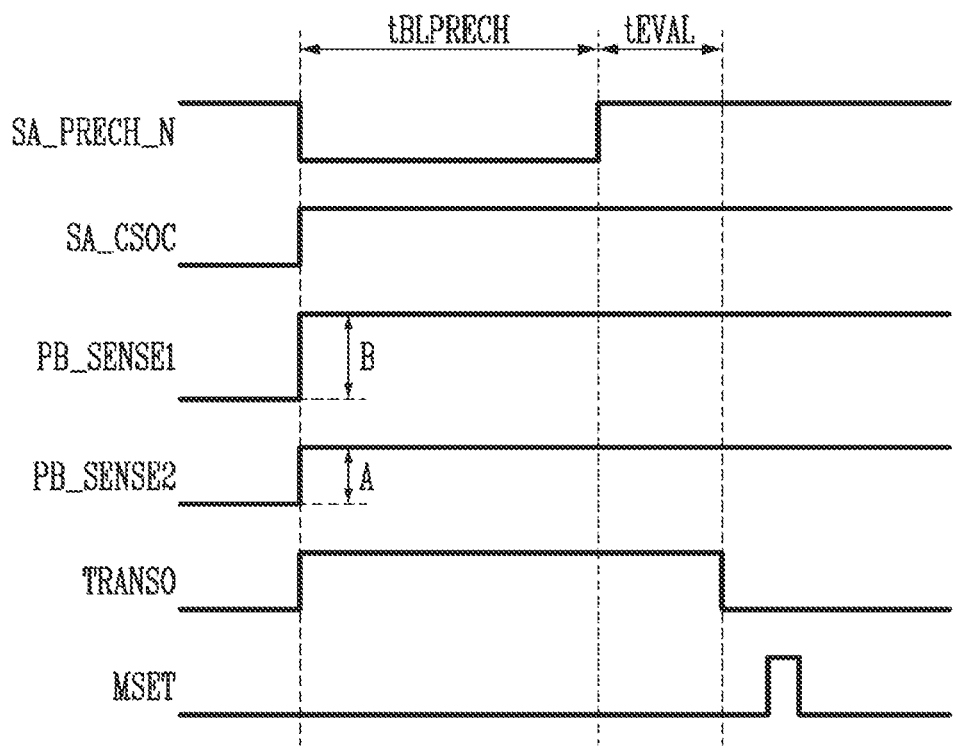
FIG. 9 is a waveform diagram of signals for describing a program verify operation of the page buffer of FIG. 7 according to an embodiment of the present disclosure.

FIG. 9 is a waveform diagram of signals for describing the program verify operation of the page buffer of FIG. 7 according to an embodiment of the present disclosure.

The program verify operation of the page buffer according to an embodiment of the present disclosure will be described with reference to FIGS. 7 and 9 as follows.

In an embodiment of the present disclosure, a method of verifying each of the first program state PV1 and the second program state PV2 by applying the verify voltage $V_{PV2}$ to the selected word line will be described as an example.

When the data to be programmed corresponding to the first program state PV1 is stored in the page buffer PB1 among the plurality of page buffers, the node QS of the latch circuit S_LATCH and the node QF of the latch circuit F_LATCH of the page buffer PB1 are set to a low level.

In a bit line precharge period tBLPRECH, the PMOS transistor P1 is turned on in response to the potential level of the node QS, the PMOS transistor P2 is turned on in response to the precharge signal SA_PRECH_N of a low level, and thus the main sensing node SO is precharged to a level of the power voltage VDD. The NMOS transistor N5 is turned on in response to the control signal SA_CSOC of a high level, and thus the second common node CSO2 is charged to a VDD−Vth (the threshold voltage of N5) level. The NMOS transistor N3 is turned on in response to the second page buffer sensing signal PB_SENSE2 of an A level to form the current path connecting the second common node CSO2 and the first common node CSO1 to each other, and thus the first common node CSO1 is charged to the potential A of the second page buffer sensing signal PB_SENSE2−Vth (the threshold voltage of N3). Therefore, the bit line BL1 is precharged to the first setting level (PB_SENSE2−Vth).

When the verify voltage $V_{PV2}$ is applied to the selected word line, the memory cell connected to the selected word line among the memory cells connected to the bit line BL1 is turned off when the threshold voltage is higher than the verify voltage $V_{PV1}$ and is turned on when the threshold voltage is lower than the verify voltage $V_{PV1}$. That is, the current amount flowing through the bit line BL1 changes according to the threshold voltage of the memory cell.

Thereafter, in an evaluation period tEVAL, the precharge signal SA_PRECH_N transits to a high level, the power voltage VDD applied to the main sensing node SO is cut off, the main sensing node SO and the second common node CSO2 are electrically connected to each other in response to a transmission signal TRANSO, and the potential level of the main sensing node SO changes according to the current amount of the bit line BL1.

When the evaluation period tEVAL is ended, the transmission signal TRANSO transits to a low level, the NMOS transistor N6 is turned off, and the main sensing node SO and the bit line BL1 are electrically disconnected from each other. The NMOS transistor N27 of the latch circuit M_LATCH may be turned on or turned off according to the potential level of the main sensing node SO. Thereafter, the set signal MSET of a high level may be applied to the NMOS transistor N26, and thus the node QM_N may maintain a high level or transit to a low level to store the verify data.

When the data to be programmed corresponding to the second program state PV2 is stored in the page buffer PB1 among the plurality of page buffers, the node QS of the latch circuit S_LATCH of the page buffer PB1 is set to a low level and the node QF of the latch circuit F_LATCH is set to a high level.

In the bit line precharge period tBLPRECH, the PMOS transistor P1 is turned on in response to the potential level of the node QS, the PMOS transistor P2 is turned on in response to the precharge signal SA_PRECH_N of a low level, and thus the main sensing node SO is precharged to the level of the power voltage VDD. The NMOS transistor N5 is turned on in response to the control signal SA_CSOC of a high level, and thus the second common node CSO2 is charged to a VDD−Vth (the threshold voltage of N5) level. The NMOS transistor N3 is turned on in response to the second page buffer sensing signal PB_SENSE2 of the A level to form the current path connecting the second common node CSO2 and the first common node CSO1 to each other, and the NMOS transistor N4 is turned on in response to the potential level of the node QF to form the current path connecting the second common node CSO2 and the first command node CSO1 to each other. At this time, since the potential level of the node QF applied to the gate of the NMOS transistor N4 is higher than the potential level of the second page buffer sensing signal PB_SENSE2, the potential level of the second common node CSO2 is transferred to the first common node CSO1 without a clamping operation. Therefore, the first common node CSO1 is charged to a VDD−Vth (the threshold voltage of N5) level. In addition, the NMOS transistor N2 is turned on in response to the first page buffer sensing signal PB_SENSE1 of a B level higher than A of the second page buffer sensing signal PB_SENSE2, and thus the bit line BL1 is precharged, the clamping operation is generated by the NMOS transistor N2, and thus the bit line BL1 is precharged to the second setting level (PB_SENSE1−Vth).

When the verify voltage $V_{PV2}$ is applied to the selected word line, the memory cell connected to the selected word line among the memory cells connected to the bit line BL1 is turned on when the threshold voltage is higher than the verify voltage $V_{PV2}$ and is turned off when the threshold voltage is lower than the verify voltage $V_{PV2}$. That is, the current amount flowing through the bit line BL1 changes according to the threshold voltage of the memory cell.

Thereafter, in the evaluation period tEVAL, the precharge signal SA_PRECH_N transits to a high level, the power voltage VDD applied to the main sensing node SO is cut off, the main sensing node SO and the second common node CSO2 are electrically connected to each other in response to the transmission signal TRANSO, and the potential level of the main sensing node SO changes according to the current amount of the bit line BL1.

When the evaluation period tEVAL is ended, the transmission signal TRANSO transits to a low level, the NMOS transistor N6 is turned off, and the main sensing node SO and the bit line BL1 are electrically disconnected from each other. The NMOS transistor N27 of the latch circuit M_LATCH may be turned on or turned off according to the potential level of the main sensing node SO. Thereafter, the set signal MSET of a high level may be applied to the NMOS transistor N26, and thus the node QM_N may maintain a high level or transition to a low level to store the verify data.

In the above-described program verify operation, the method of performing the program verify operation on the first program state PV1 and the second program state PV2 using the verify voltage $V_{PV2}$ is described. After the program verify operation on the first program state PV1 and the second program state PV2, the program verify operation on the third program state PV3 to the fifteenth program state PV15 are performed by sequentially performing the program verify operation using the verify voltage $V_{PV4}$ to the program verify operation using the verify voltage $V_{PV15}$.

TABLE 1

| | Lower program state | Higher program state | Remaining program states |
|---|---|---|---|
| QS | 0(low level) | 0(low level) | 1(high level) |
| QF | 0(low level) | 1(high level) | 0(low level) |
| CSO2 | VDD − Vth | VDD − Vth | GND(VSS) |
| CSO1 | PB_SENSE2 − Vth | VDD − Vth | GND(VSS) |
| BL | PB_SENSE2 − Vth | PB_SENSE1 − Vth | GND(VSS) |

Table 1 is a table illustrating a set state of the nodes QS and QF of the latch circuits and the precharge levels of the first and second common nodes CSO1 and CSO2 and the bit line BL during the program verify operation using one verify voltage.

In Table 1, the lower program state and the higher program state indicate a lower program state in which a threshold voltage distribution is low and a higher program state in which the threshold voltage distribution is high, respectively, among two program states for program verify using one verify voltage.

For example, during the program verify operation using the verify voltage $V_{PV2}$, the lower program state is the first program state PV1, the higher program state is the second program state PV2, and the remaining program states are the third program state to the fifteenth program state PV3 to PV15.

As described above, according to an embodiment of the present disclosure, when a bit line precharge level is adjusted during the program verify operation according to the program state of the memory cells to be programmed, the verify operation on at least two or more program states may be performed using one verify voltage. Therefore, the program verify operation time may be improved.

In addition, in an above-described embodiment, the bit line precharge level is adjusted to two levels as an example. However, the bit line precharge level may be adjusted to three or more levels to perform the verify operation on three or more program states using one verify voltage. To this end, two NMOS transistors that are connected in parallel between the second common node CSO2 and the NMOS transistor N3 of FIG. 7 may be additionally configured, and the two NMOS transistors are configured to operate in response to the node QF and a page buffer sensing signal having a potential level lower than the second page buffer sensing signal PB_SENSE2, respectively.

Figure 10:
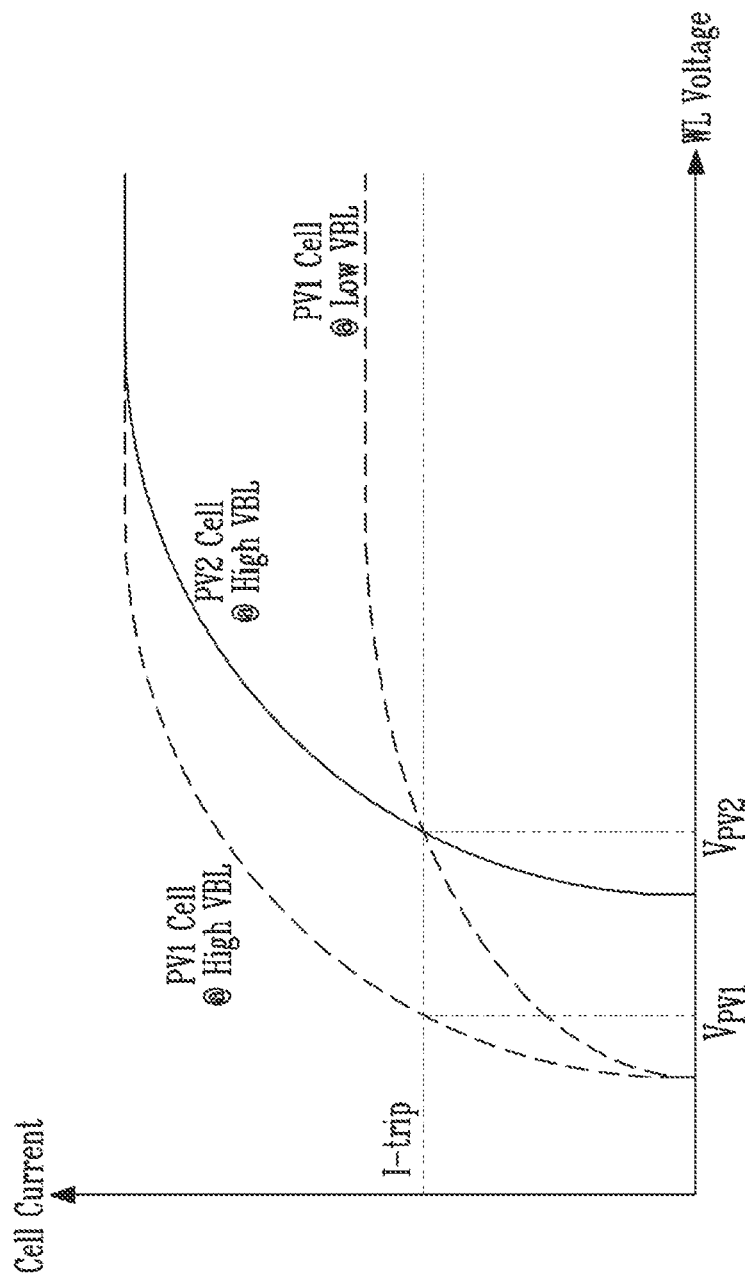
FIG. 10 is a graph for describing a cell current change of two adjacent program states according to a precharge voltage level of the bit line.

FIG. 10 is a graph for describing a cell current change of two adjacent program states according to the precharge voltage level of the bit line.

Referring to FIG. 10, in a case where the bit line is precharged to a relatively high level @High VBL, when the verify voltage $V_{PV2}$ is applied to the word line, a memory cell PV2 Cell corresponding to the second program state may be divided into a cell in which program is completed and a cell in which the program is not completed based on a reference current I-trip.

In a case where the bit line is precharged to a relatively low level (@Low VBL), when the verify voltage $V_{PV2}$ is applied to the word line, a memory cell PV1 Cell corresponding to the first program state may be divided into a cell in which program is completed and a cell in which the program is not completed based on the reference current I-trip.

That is, when the program verify operation is performed by applying the verify voltage $V_{PV2}$ to the word line in a state in which the bit line is precharged to a relatively low level during the program verify operation of the memory cell PV1 Cell corresponding to the first program state, the memory cell PV1 Cell may be divided into the cell in which the program is completed and the cell in which the program is not completed based on the reference current I-trip identically to performing the program verify operation by precharging the bit line to a relatively high level and applying the verify voltage $V_{PV1}$ to the word line.

Figure 11:
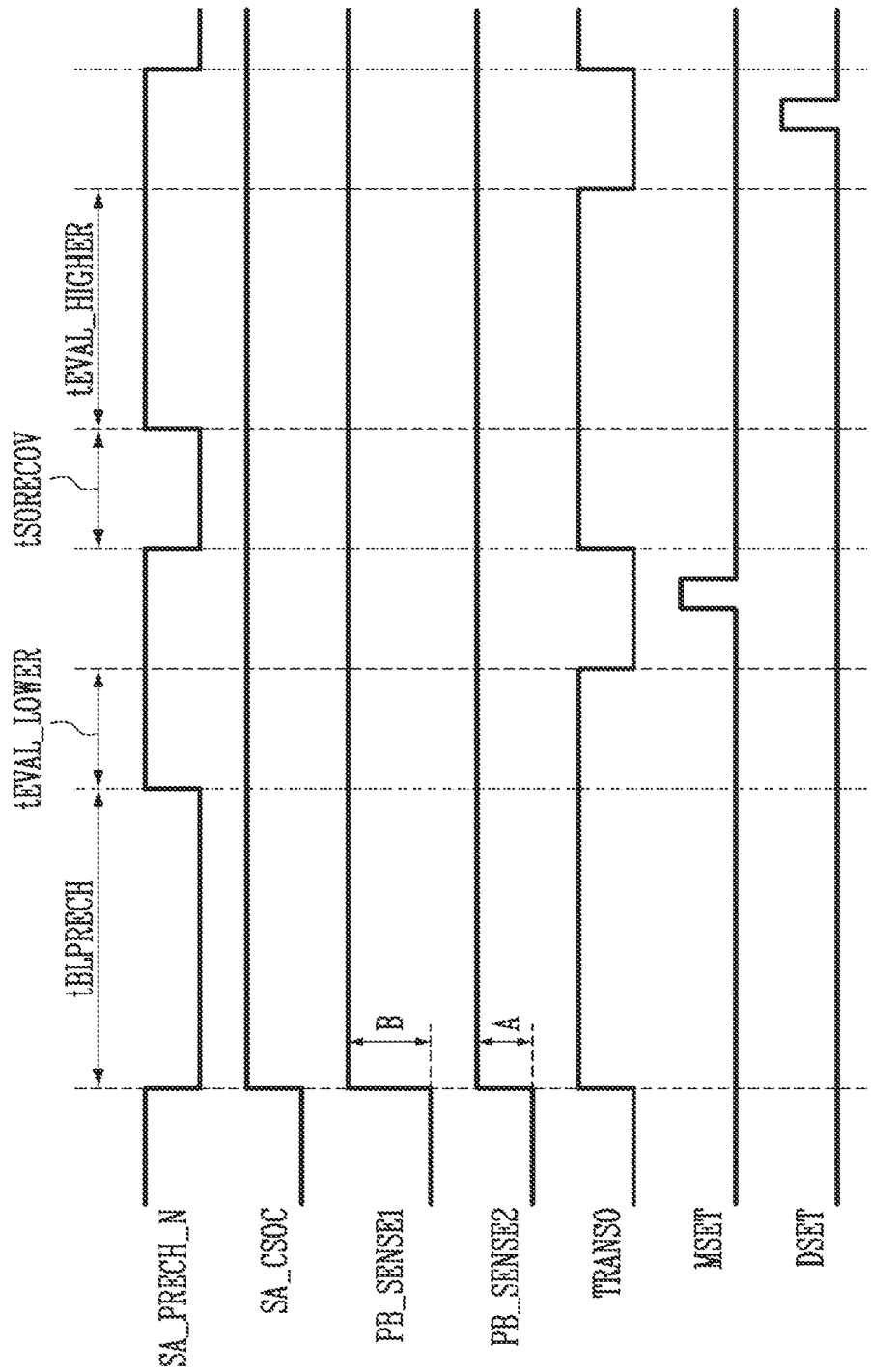
FIG. 11 is a waveform diagram of signals for describing the program verify operation of the page buffer of FIG. 7 according to another embodiment of the present disclosure.

FIG. 11 is a waveform diagram of signals for describing the program verify operation of the page buffer of FIG. 7 according to another embodiment of the present disclosure.

The program verify operation of the page buffer according to another embodiment of the present disclosure will be described with reference to FIGS. 7 and 11 as follows.

In an embodiment of the present disclosure, a method of verifying each of the first program state PV1 and the second program state PV2 by applying the verify voltage $V_{PV2}$ to the selected word line will be described as an example.

When the data to be programmed corresponding to the first program state PV1 is stored in the page buffer PB1 among the plurality of page buffers, the node QS of the latch circuit S_LATCH and the node QF of the latch circuit F_LATCH of the page buffer PB1 are set to a low level.

When the data to be programmed corresponding to the second program state PV2 is stored in the page buffer PB1 among the plurality of page buffers, the node QS of the latch circuit S_LATCH of the page buffer PB1 is set to a low level and the node QF of the latch circuit F_LATCH is set to a high level.

In the bit line precharge period tBLPRECH, the PMOS transistor P1 is turned on in response to the potential level of the node QS, the PMOS transistor P2 is turned on in response to the precharge signal SA_PRECH_N of a low level, and thus the main sensing node SO is precharged to the level of the power voltage VDD. The NMOS transistor N5 is turned on in response to the control signal SA_CSOC of a high level, and thus the second common node CSO2 is charged to a VDD-Vth (the threshold voltage of N5) level.

When the node QF is set to a low level, the NMOS transistor N3 is turned on in response to the second page buffer sensing signal PB_SENSE2 of the A level to form the current path connecting the second common node CSO2 and the first common node CSO1 to each other, and thus the first common node CSO1 is charged to the potential A of the second page buffer sensing signal PB_SENSE2-Vth (the threshold voltage of N3). Therefore, the bit line BL1 is precharged to the first setting level (PB_SENSE2-Vth).

When the node QF is set to a high level, the NMOS transistor N3 is turned on in response to the second page buffer sensing signal PB_SENSE2 of the A level to form the current path connecting the second common node CSO2 and the first common node CSO1 to each other, and the NMOS transistor N4 is turned on in response to the potential level of the node QF to form the current path connecting the second common node CSO2 and the first command node CSO1 to each other. At this time, since the potential level of the node QF applied to the gate of the NMOS transistor N4 is higher than the potential level of the second page buffer sensing signal PB_SENSE2, the potential level of the second common node CSO2 is transferred to the first common node CSO1 without a clamping operation. Therefore, the first common node CSO1 is charged to a VDD-Vth (the threshold voltage of N5) level. In addition, the NMOS transistor N2 is turned on in response to the first page buffer sensing signal PB_SELSE1 of a B level higher than A, and thus the bit line BL1 is precharged, the clamping operation is generated by the NMOS transistor N2, and thus the bit line BL1 is precharged to the second setting level (PB_SENSE1-Vth).

When the verify voltage $V_{PV2}$ is applied to the selected word line, the memory cell connected to the selected word line among the memory cells connected to the bit line BL1 is turned on when the threshold voltage is higher than the verify voltage $V_{PV1}$ and is turned off when the threshold voltage is lower than the verify voltage $V_{PV1}$. That is, the current amount flowing through the bit line BL1 changes according to the threshold voltage of the memory cell.

Thereafter, in an evaluation period tEVAL_LOWER corresponding to the first program state PV1, the precharge signal SA_PRECH_N transits to a high level, the power voltage VDD applied to the main sensing node SO is cut off, the main sensing node SO and the second common node CSO2 are electrically connected to each other in response to the transmission signal TRANSO, and the potential level of the main sensing node SO changes according to the current amount of the bit line BL1.

When the evaluation period tEVAL_LOWER corresponding to the first program state PV1 is ended, the transmission signal TRANSO transits to a low level, the NMOS transistor N6 is turned off, and the main sensing node SO and the bit line BL1 are electrically disconnected from each other. The NMOS transistor N27 of the latch circuit M_LATCH may be turned on or turned off according to the potential level of the main sensing node SO. Thereafter, the set signal MSET of a high level may be applied to the NMOS transistor N26, and thus the node QM_N may maintain a high level or transit to a low level to store the verify data.

Thereafter, in a sensing node recovery period tSORECOV, the PMOS transistor P1 is turned on in response to the potential level of the node QS, the PMOS transistor P2 is turned on in response to the precharge signal SA_PRECH_N of a low level, and thus the main sensing node SO is precharged to the level of the power voltage VDD.

Thereafter, in an evaluation period tEVAL_HIGHER corresponding to the second program state PV2, the precharge signal SA_PRECH_N transits to a high level, the power voltage VDD applied to the main sensing node SO is cut off, the main sensing node SO and the second common node CSO2 are electrically connected to each other in response to the transmission signal TRANSO, and the potential level of the main sensing node SO changes according to the current amount of the bit line BL1. It is preferable to set the evaluation period tEVAL_HIGHER to be longer than the evaluation period tEVAL_LOWER. For example, among the plurality of program states on which the program verify is to be performed using one verify voltage, an evaluation period corresponding to the program state in which the threshold voltage distribution is relatively low may be set to be relatively short, and an evaluation period corresponding to the program state in which the threshold voltage distribution is relatively high may be set to be relatively long.

When the evaluation period tEVAL_HIGHER corresponding to the second program state PV2 is ended, the transmission signal TRANSO transits to a low level, the NMOS transistor N6 is turned off, and the main sensing node SO and the bit line BL1 are electrically disconnected from each other. The NMOS transistor N22 of the latch circuit D_LATCH is turned on or turned off according to the potential level of the main sensing node SO. Thereafter, the set signal DSET of a high level may be applied to the NMOS transistor N21, and thus the node QD_N may maintain a high level or transit to a low level to store verify data corresponding to the second program state.

As described above, according to another embodiment of the present disclosure, during the program verify operation, the bit line is precharged to different precharge levels according to the program state, and the evaluation period reflecting the current amount of the bit line to the potential level of the sensing node is divided according to the program state. That is, accuracy of the program verify operation may be further improved by setting the evaluation period during the program verify operation of the program state in which the threshold voltage distribution is low to be short and setting the evaluation period during the program verify operation of the program state in which the threshold voltage distribution is high to be long to improve a cell current different between the program states.

Figure 12:
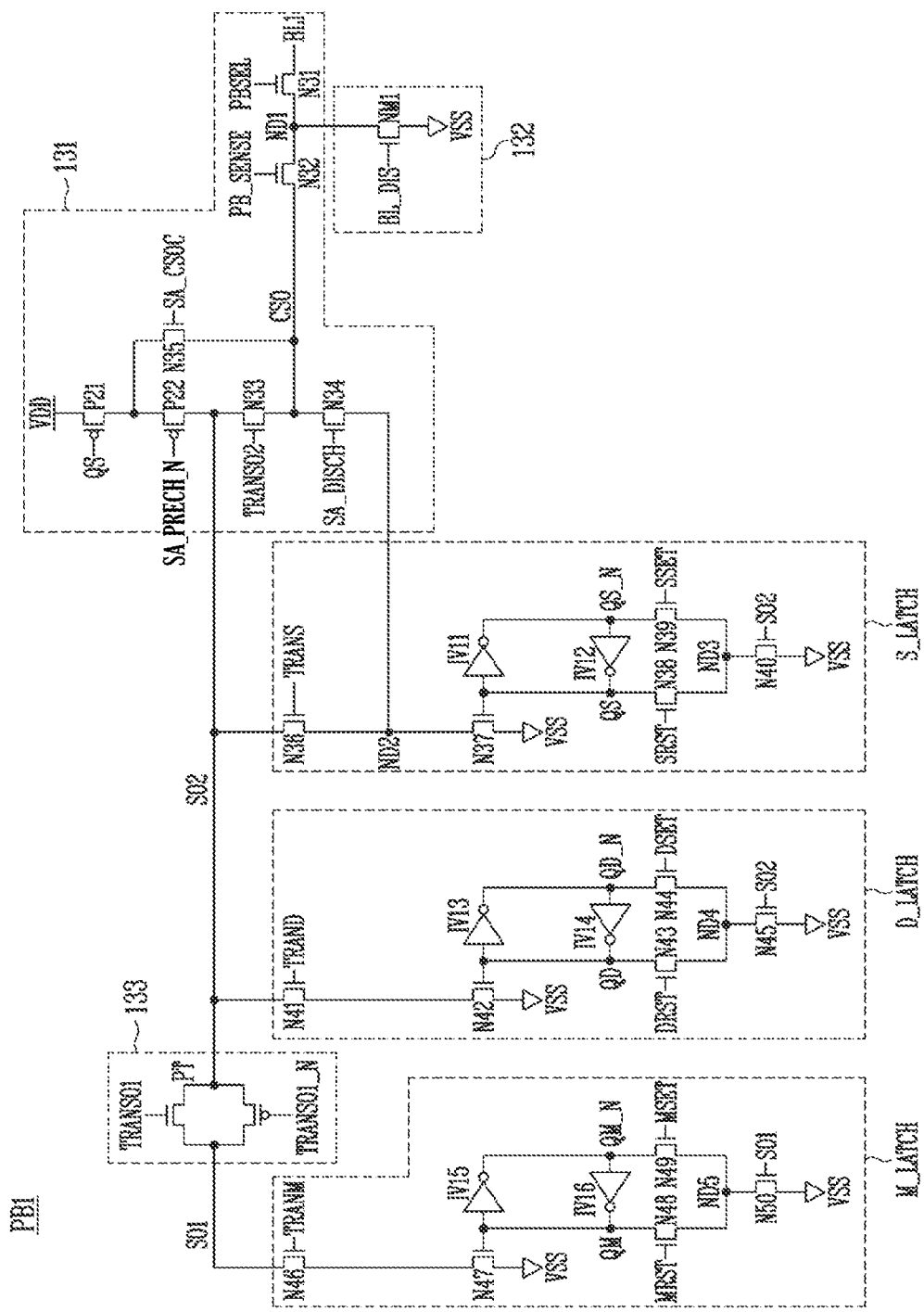
FIG. 12 is a diagram for describing the page buffer according to another embodiment of the present disclosure.

FIG. 12 is a diagram for describing the page buffer according to another embodiment of the present disclosure.

The plurality of page buffers PB1 to PBm shown in FIG. 2 may be configured in a structure similar to each other, and in an embodiment of the present disclosure, a structure of the page buffer PB1 will be described as an example.

The page buffer PB1 may include a bit line controller 131, a bit line discharger 132, a sensing node connection component 133, and a plurality of latch circuits S_LATCH, D_LATCH, and M_LATCH.

During the program voltage apply operation of the program operation, the bit line controller 131 controls a potential level of the corresponding bit line BL1 to a program inhibit voltage (for example, VDD) or a program permit voltage (for example, VSS). Thereafter, during an evaluation period, the bit line controller 131 electrically connects the bit line BL1 and a second sensing node SO2 to each other to control a potential level of the second sensing node SO2 and a first sensing node Sa1 connected to the second sensing node SO2 according to a current change amount of the bit line BL1. The second sensing node SO2 may be referred to as a main sensing node, and the first sensing node SO1 may be referred to as a sub sensing node.

The bit line controller 131 may include a plurality of NMOS transistors N31 to N35 and a plurality of PMOS transistors P11 and P12.

The NMOS transistor N31 is connected between the bit line BL1 and a node ND1, and is turned on in response to a page buffer select signal PBSEL to electrically connect the bit line BL1 and the node ND1 to each other.

The NMOS transistor N32 is connected between the node ND1 and a common node CSO, and is turned on in response to a page buffer sensing signal PB_SENSE to electrically connect the node ND1 and the common node CSO to each other.

The PMOS transistor P11 and the PMOS transistor P12 are connected in series between a terminal of the power voltage VDD and the second sensing node SO2, and are turned on in response to the node QS of the latch circuit S_LATCH and a precharge signal SA_PRECH_N, respectively.

The NMOS transistor N35 is connected between the common node CSO and a node between the PMOS transistor P11 and the PMOS transistor P12, and is turned on in response to a control signal SA_CSOC to supply the power voltage VDD supplied through the PMOS transistor P11 to the common node CSO.

The NMOS transistor N33 is connected between the second sensing node SO2 and the common node CSO, and is turned on in response to a second transmission signal TRANSO2 to electrically connect the second sensing node SO2 and the common node CSO to each other.

The NMOS transistor N34 is connected between the common node CSO and the node ND2 of the latch circuit S_LATCH, and is turned on in response to a discharge signal SA_DISCH to electrically connect the common node CSO and the node ND2 to each other.

The bit line discharger 132 is connected to the node ND1 of the bit line controller 131 to discharge the potential level of the bit line BL1.

The bit line discharger 132 may include an NMOS transistor NM1 connected between the node ND1 and a terminal of the ground power VSS, and the NMOS transistor NM1 is turned on in response to a bit line discharge signal BL_DIS to electrically connect the node ND1 and the terminal of the ground power VSS.

The latch circuit S_LATCH may include a plurality of NMOS transistors N36 to N40 and inverters IV11 and IV12.

The inverters IV11 and IV12 are connected in parallel in a reverse direction between the node QS and a node QS_N.

The NMOS transistor N36 and the NMOS transistor N37 are connected in series between the second sensing node SO2 and the terminal of the ground power VSS, the NMOS transistor N36 is turned on in response to a transmission signal TRANS, and the NMOS transistor N37 is turned on or turned off according to the potential level of the node QS.

The NMOS transistor N38 is connected between the node QS and a node ND3, and is turned on in response to a reset signal SRST to electrically connect the node QS and the node ND3 to each other. The NMOS transistor N39 is connected between a node QS_N and the node ND3, and is turned on in response to a set signal SSET to electrically connect the node QS_N and the node ND3 to each other. The NMOS transistor N40 is connected between the node ND3 and the terminal of the ground power VSS, and is turned on according to the potential of the second sensing node SO2 to electrically connect the node ND3 and the terminal of the ground power VSS to each other. For example, in a state in which the second sensing node SO2 is precharged to a high level, when the reset signal SRST is applied to the NMOS transistor N38 as a high level, the node QS and the node QS_N are initialized to a low level (0) and a high level (1), respectively. In addition, in a state in which the second sensing node SO2 is precharged to a high level, the set signal SSET is applied to the NMOS transistor N39 as a high level, the node QS and the node QS_N are set to a high level (1) and a low level (0), respectively.

The latch circuit D_LATCH senses the verify data based on the potential of the second sensing node SO2 in which the evaluation operation is performed during a relatively long evaluation period during the program verify operation. For example, the latch circuit D_LATCH senses the verify data for a program state in which the threshold voltage distribution is relatively high in an operation of performing the program verify operation on at least two program states using one verify voltage.

The latch circuit D_LATCH may include a plurality of NMOS transistors N41 to N45 and inverters IV13 and IV14.

The inverters IV13 and IV14 are connected in parallel in a reverse direction between a node QD and a node QD_N.

The NMOS transistor N41 and the NMOS transistor N42 are connected in series between the second sensing node SO2 and the terminal of the ground power VSS, the NMOS transistor N41 is turned on in response to a transmission signal TRAND, and the NMOS transistor N42 is turned on or turned off according to a potential level of the node QD.

The NMOS transistor N43 is connected between the node QD and a node ND4, and is turned on in response to a reset signal DRST to electrically connect the node QD and the node ND4 to each other. The NMOS transistor N44 is connected between the node QD_N and the node ND4, and is turned on in response to a set signal DSET to electrically connect the node QD_N and the node ND4 to each other. The NMOS transistor N45 is connected between the node ND4 and the terminal of the ground power VSS, and is turned on according to the potential of the second sensing node SO2 to electrically connect the node ND5 and the terminal of the ground power VSS to each other.

For example, when the NMOS transistor N44 is turned on by applying the set signal DSET of a high level during the program verify operation, the NMOS transistor N45 is turned on or turned off according to the potential level of the second sensing node SO2, which is maintained or changed according to the current amount of the bit line BL1, and thus the verify data may be stored in the latch circuit D_LATCH.

The latch circuit M_LATCH senses the verify data based on the potential of the first sensing node SO1 in which the evaluation operation is performed during a relatively short evaluation period during the program verify operation. For example, the latch circuit M_LATCH senses the verify data for a program state in which the threshold voltage distribution is relatively low in an operation of performing the program verify operation on at least two program states using one verify voltage.

The latch circuit M_LATCH may include a plurality of NMOS transistors N46 to N50 and inverters IV15 and IV16.

The inverters IV15 and IV16 are connected in parallel in a reverse direction between a node QM and a node QM_N.

The NMOS transistor N46 and the NMOS transistor N47 are connected in series between the first sensing node SO1 and the terminal of the ground power VSS, the NMOS transistor N46 is turned on in response to a transmission signal TRANM, and the NMOS transistor N47 is turned on or turned off according to a potential level of the node QM.

The NMOS transistor N48 is connected between the node QM and a node ND5, and is turned on in response to a reset signal MRST to electrically connect the node QM and the node ND5 to each other. The NMOS transistor N49 is connected between the node QM_N and the node ND5, and is turned on in response to a set signal MSET to electrically connect the node QM_N and the node ND5 to each other. The NMOS transistor N50 is connected between the node ND6 and the terminal of the ground power VSS, and is turned on according to the potential of the first sensing node SO1 to electrically connect the node ND5 and the terminal of the ground power VSS to each other.

For example, when the NMOS transistor N49 is turned on by applying the set signal MSET of a high level during the program verify operation, the NMOS transistor N50 is turned on or turned off according to the potential level of the first sensing node SO1, which is maintained or changed according to the current amount of the bit line BL1, and thus the verify data may be stored in the latch circuit M_LATCH.

The sensing node connection component 133 is connected between the first sensing node SO1 and the second sensing node SO2. The sensing node connection component 133 may include a pass transistor PT that electrically connects or disconnects between the first sensing node SO1 and the second sensing node SO2 in response to a first transmission signal TRANSO1 and a first inversion transmission signal TRANSO1_N.

The sensing node connection component 133 performs the evaluation operation to control the potential level of the first sensing node SO1 and the second sensing node SO2 according to the current amount of the bit line BL1 by electrically connecting the first sensing node SO1 and the second sensing node SO2 to each other during a first evaluation period. Thereafter, the sensing node connection component 133 performs the evaluation operation to control the potential level of the second sensing node SO2 according to the current amount of the bit line BL1 in a state in which the first sensing node SO1 and the second sensing node SO2 are electrically disconnected from each other during a set time. Therefore, the evaluation operation is performed on the first sensing node SO1 during the first evaluation period, and the evaluation operation is performed on the second sensing node SO2 during a second evaluation period longer than the first evaluation period.

Accordingly, in an operation of performing the program verify operation on at least two program states using one verify voltage, the first sensing node SO1 may reflect the verify data according to the program state in which the threshold voltage distribution is relatively low and the first sensing node SO2 may reflect the verify data according to the program state in which the threshold voltage distribution is relatively high.

Figure 13:
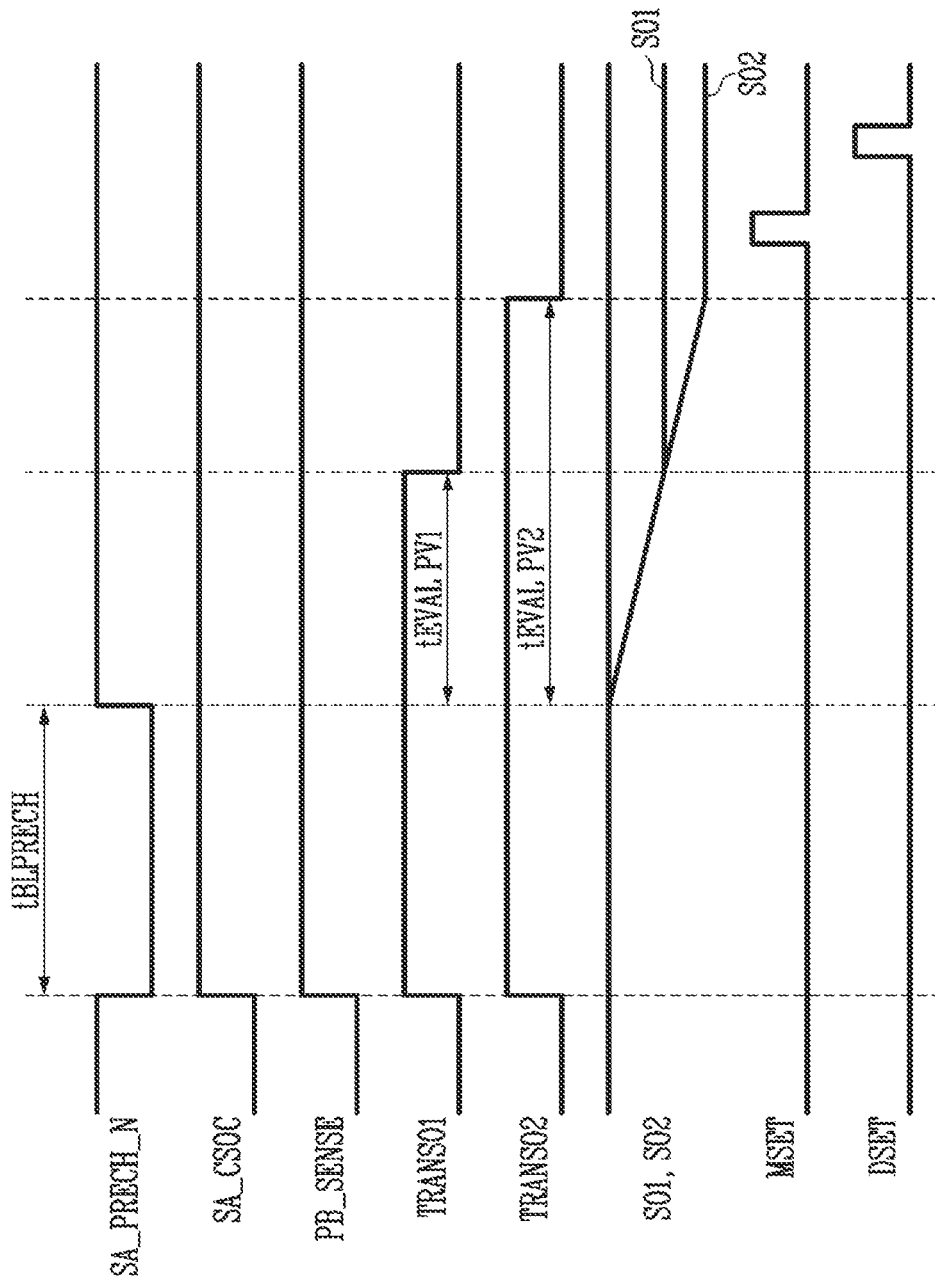
FIG. 13 is a waveform diagram of signals for describing the program verify operation of the page buffer of FIG. 12 according to an embodiment of the present disclosure.

FIG. 13 is a waveform diagram of signals for describing the program verify operation of the page buffer of FIG. 12 according to an embodiment of the present disclosure.

The program verify operation of the page buffer will be described with reference to FIGS. 12 and 13 as follows.

In an embodiment of the present disclosure, a method of verifying each of the first program state PV1 and the second program state PV2 by applying the verify voltage $V_{PV2}$ to the selected word line will be described as an example.

During the program verify operation, the node QS of the latch circuit S_LATCH of the page buffer PB1 is set to a low level.

In a bit line precharge period tBLPRECH, the PMOS transistor P21 is turned on in response to the potential level of the node QS, the PMOS transistor P22 is turned on in response to the precharge signal SA_PRECH_N of a low level, and thus the power voltage VDD is applied to the second sensing node SO2. At this time, the sensing node connection component 133 electrically connects the first sensing node SO1 and the second sensing node SO2 to each other in response to the first transmission signal TRANSO1 and the first inversion transmission signal TRANSO1_N, and thus the first sensing node SO1 and the second sensing node SO2 are precharged to the level of the power voltage VDD.

In addition, the NMOS transistor N35 is turned on in response to the control signal SA_CSOC, the NMOS transistor N32 and the NMOS transistor N31 are turned on in response to the page buffer sensing signal PB_SENSE and the bit line select signal PBSEL, respectively, to precharge the bit line BL1.

Thereafter, the PMOS transistor P22 is turned off in response to the precharge signal SA_PRECH_N of a high level, the power voltage VDD applied to the second sensing node SO2 is cut off. During a first evaluation period tEVAL PV1 for the program verify operation of the memory cells corresponding to the first program state PV1, the sensing node connection component 133 electrically connects the first sensing node SO1 and the second sensing node SO2 to each other in response to the first transmission signal TRANSO1 and the first inversion transmission signal TRANSO1_N, and thus the evaluation operation is performed on the first sensing node SO1 and the second sensing node SO2 together during the first evaluation period tEVAL PV1. Therefore, the potential level of the first sensing node SO1 and the second sensing node SO2 maintains a precharge level or is decreased according to a threshold voltage value of the memory cell connected to the corresponding bit line during the first evaluation period tEVAL PV1.

When the first evaluation period tEVAL PV1 is ended, the sensing node connection component 133 electrically disconnect the first sensing node SO1 and the second sensing node SO2 from each other in response to the first transmission signal TRANSO1 and the first inversion transmission signal TRANSO1_N. Therefore, only the second sensing node SO2 is electrically connected to the bit line BL1 and the evaluation operation is continuously performed. Thus, the potential level of the second sensing node SO2 may maintain the precharge level or may be decreased according to the threshold voltage value of the memory cell connected to the corresponding bit line during a second evaluation period tEVAL PV2 for the program verify operation of the memory cells corresponding to the second program state PV2. That is, when the evaluation operation is performed on the second sensing node SO2 during the second evaluating period tEVAL PV2 longer than the first evaluating period tEVAL PV1, a decrease width of the potential level of the second sensing node SO2 may be greater than that of the first sensing node Sal. That is, the potential level of the second sensing node SO2 may be evaluated to a level lower than that of the first sensing node SO1.

When the second evaluation period tEVAL PV2 is ended, the NMOS transistor N33 is turned off in response to the second transmission signal TRANSO2, and thus the second sensing node SO2 and the common node CSO are disconnected from each other.

The NMOS transistor N50 of the latch circuit M_LATCH is turned on or turned off according to the potential level of the first sensing node SO1. Thereafter, the set signal MSET of a high level may be applied to the NMOS transistor N49, and thus the node QM_N may maintain a high level or transit to a low level to store the verify data corresponding to the first program state PV1.

The NMOS transistor N45 of the latch circuit D_LATCH is turned on or turned off according to the potential level of the second sensing node SO2. Thereafter, the set signal DSET of a high level may be applied to the NMOS transistor N44, and thus the node QD_N may maintain a high level or transit to a low level to store the verify data corresponding to the second program state PV2.

As described above, the page buffer according to another embodiment of the present disclosure may perform a sensing operation on at least two program states together while one verify voltage is applied during the program verify operation, electrically disconnect sensing nodes respectively corresponding to the program states from each other, and perform the evaluation operation on the sensing nodes during different evaluation periods. The evaluation periods may overlap with each other and thus an operation time may be reduced.

In addition, in the above-described embodiment, the sensing operation is performed on two program states together while one verify voltage is applied by electrically separating the first sensing node and the second sensing node from each other as an example. However, a verify operation on three or more program states may be performed by separating the sensing node into at least three.

Figure 14:
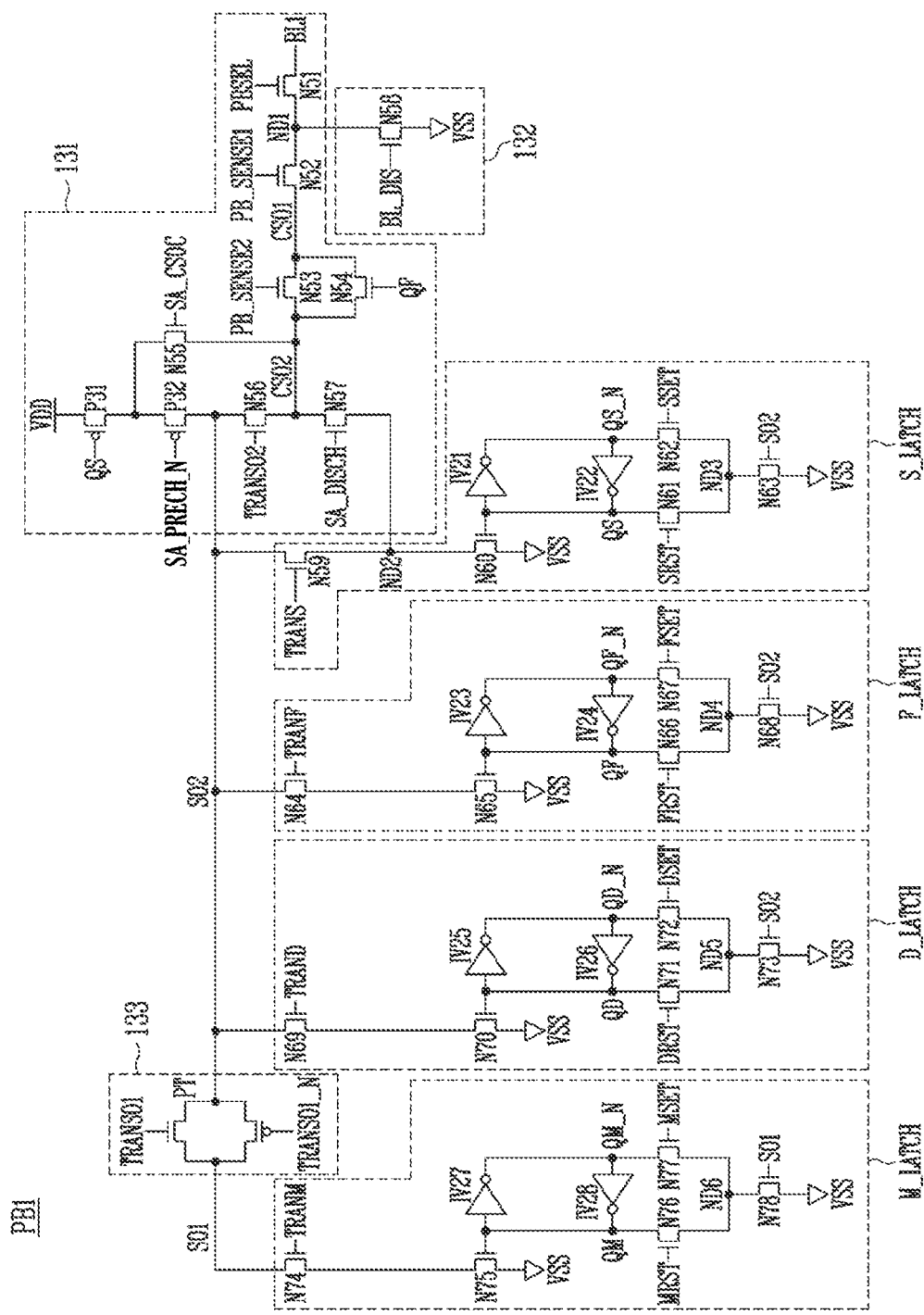
FIG. 14 is a diagram for describing the page buffer according to still another embodiment of the present disclosure.

FIG. 14 is a diagram for describing the page buffer according to still another embodiment of the present disclosure.

The plurality of page buffers PB1 to PBm shown in FIG. 2 may be configured in a structure similar to each other, and in an embodiment of the present disclosure, a structure of the page buffer PB1 will be described as an example.

The page buffer PB1 shown in FIG. 14 may be a structure in which the structures of the page buffer PB1 of FIG. 7 and the page buffer PB1 of FIG. 12 described above are combined with each other.

Referring to FIG. 14, the page buffer PB1 may include a bit line controller 131, a bit line discharger 132, a sensing node connection component 133, and a plurality of latch circuits S_LATCH, D_LATCH, and M_LATCH.

During the program voltage apply operation of the program operation, the bit line controller 131 controls a potential level of the corresponding bit line BL1 to a program inhibit voltage (for example, VDD) or a program permit voltage (for example, VSS). During the program verify operation of the program operation, the bit line controller 131 precharges the potential level of the corresponding bit line BL1 to the first setting level or the second setting level according to data stored in the latch F_LATCH. Thereafter, during first and second evaluation periods, the bit line controller 131 electrically connects the bit line BL1 and a second sensing node SO2 to each other to control a potential level of a first sensing node SO1 and the second sensing node SO2 according to a current change amount of the bit line BL1. The second sensing node SO2 may be referred to as a main sensing node, and the first sensing node SO1 may be referred to as a sub sensing node.

The bit line controller 131 may include a plurality of NMOS transistors N51 to N55 and a plurality of PMOS transistors P31 and P32.

The NMOS transistor N51 is connected between the bit line BL1 and a node ND1, and is turned on in response to a page buffer select signal PBSEL to electrically connect the bit line BL1 and the node ND1 to each other.

The NMOS transistor N52 is connected between the node ND1 and a first common node CSO1, and is turned on in response to a first page buffer sensing signal PB_SENSE1 to electrically connect the node ND1 and the first common node CSO1 to each other.

The NMOS transistor N53 and the NMOS transistor N54 are connected in parallel between a second common node CSO2 and the first common node CSO1. The NMOS transistor N53 is turned on in response to a second page buffer sensing signal PB_SENSE2 to form a current path connecting the second common node CSO2 and the first common node CSO1 to each other, and the NMOS transistor N54 is turned on in response to the potential of the node QF of the latch circuit F_LATCH to form a current path connecting the second common node CSO2 and the first common node CSO1 to each other. The potential level when the second page buffer sensing signal PB_SENSE2 is a high level is lower than the potential level when the first page buffer sensing signal PB_SENSE1 is a high level. In addition, the potential level when the node QF potential is a high level is higher than the potential level when the second page buffer sensing signal PB_SENSE2 is a high level.

The PMOS transistor P31 and the PMOS transistor P32 are connected in series between a terminal of the power voltage VDD and the second sensing node SO2, and are turned on in response to the node QS of the latch circuit S_LATCH and a precharge signal SA_PRECH_N, respectively.

The NMOS transistor N55 is connected between the second common node CSO2 and a node between the PMOS transistor P31 and the PMOS transistor P32, and is turned on in response to a control signal SA_CSOC to supply the power voltage VDD supplied through the PMOS transistor P31 to the common node CSO.

The NMOS transistor N56 is connected between the second sensing node SO2 and the second common node CSO2, and is turned on in response to a second transmission signal TRANSO2 to electrically connect the second sensing node SO2 and the second common node CSO2 to each other.

The NMOS transistor N57 is connected between the second common node CSO2 and the node ND2 of the latch circuit S_LATCH, and is turned on in response to a discharge signal SA_DISCH to electrically connect the second common node CSO and the node ND2 to each other.

During a bit line precharge operation of the program verify operation, the bit line controller 131 may precharge the bit line BL1 to the first setting level or the second setting level higher than the first setting level according to the node QS and the node QF.

For example, when the potential level of the node QS and the node QF is a low level, the PMOS transistor P31 is turned on in response to the potential level of the node QS, the NMOS transistor N55 is turned on in response to the control signal SA_CSOC, and thus the second common node CSO2 is charged to a VDD–Vth (a threshold voltage of N55) level. The NMOS transistor N53 is turned on in response to the second page buffer sensing signal PB_SENSE2 to form the current path between the second common node CSO2 and the first common node CSO1, and the first common node CSO1 is charged to a level of the potential level of the second page buffer sensing signal PB_SENSE2–Vth (a threshold voltage of N53). In addition, the NMOS transistor N51 and the NMOS transistor N52 are turned on in response to the page buffer select signal PBSEL and the first page buffer sensing signal PB_SENSE1, respectively, and thus the potential level of the first common node CSO1 is transferred to the bit line BL1. At this time, since the potential level of the second page buffer sensing signal PB_SENSE2 is lower than the potential level of the first page buffer sensing signal PB_SENSE1, the potential level of the first common node CSO1 is transferred to the bit line BL1 without a clamping operation. Therefore, the bit line BL1 is precharged to a level (first setting level) of the potential level of the second page buffer sensing signal PB_SENSE2–Vth (the threshold voltage of N53).

On the other hand, when the potential level of the node QS is a low level and the potential level of the node QF is a high level, the PMOS transistor P31 is turned on in response to the potential level of the node QS, the NMOS transistor N55 is turned on in response to the control signal SA_CSOC, and thus the second common node CSO2 is charged to a level of VDD–Vth (the threshold voltage of N55).

The NMOS transistor N53 is turned on in response to the second page buffer sensing signal PB_SENSE2 to form the current path between the second common node CSO2 and the first common node CSO1, and the NMOS transistor N54 is turned on in response to the potential level of the node QF to form the current path between the second common node CSO2 and the first common node CSO1. At this time, since the potential level of the node QF applied to a gate of the NMOS transistor N54 is higher than the potential level of the second page buffer sensing signal PB_SENSE2, the potential level of the second common node CSO2 is transferred to the first common node CSO1 without a clamping operation. Therefore, the first common node CSO1 is charged to a VDD–Vth (the threshold voltage of N55) level. In addition, the NMOS transistor N51 and the NMOS transistor N52 are turned on in response to the page buffer select signal PBSEL and the first page buffer sensing signal PB_SENSE1, respectively, and thus the bit line BL1 is precharged. The clamping operation is generated by the NMOS transistor N52 and thus the bit line BL1 is precharged to a level (second setting level) of the potential level of the first page buffer sensing signal PB_SENSE1–Vth (a threshold voltage of N52).

The bit line discharger 132 is connected to the node ND1 of the bit line controller 131 to discharge the potential level of the bit line BL1.

The bit line discharger 132 may include an NMOS transistor N58 connected between the node ND1 and a terminal of the ground power VSS, and the NMOS transistor N58 is turned on in response to a bit line discharge signal BL_DIS to electrically connect the node ND1 and the terminal of the ground power VSS.

The sensing node connection component 133 is connected between the first sensing node SO1 and the second sensing node SO2. The sensing node connection component 133 may include a pass transistor PT that electrically connects or disconnects between the first sensing node SO1 and the second sensing node SO2 in response to a first transmission signal TRANSO1 and a first inversion transmission signal TRANSO1_N.

The sensing node connection component 133 performs the evaluation operation to control the potential level of the first sensing node SO1 and the second sensing node SO2 according to the current amount of the bit line BL1 by electrically connecting the first sensing node SO1 and the second sensing node SO2 to each other during a first evaluation period. Thereafter, the sensing node connection component 133 performs the evaluation operation to control the potential level of the second sensing node SO2 according to the current amount of the bit line BL1 in a state in which the first sensing node SO1 and the second sensing node SO2 are electrically disconnected from each other during a set time. Therefore, the evaluation operation is performed on the first sensing node SO1 during the first evaluation period, and the evaluation operation is performed on the second sensing node SO2 during a second evaluation period longer than the first evaluation period.

Accordingly, in an operation of performing the program verify operation on at least two program states using one verify voltage, the first sensing node SO1 may reflect the verify data according to the program state in which the threshold voltage distribution is relatively low and the first sensing node SO2 may reflect the verify data according to the program state in which the threshold voltage distribution is relatively high.

The latch circuit S_LATCH may include a plurality of NMOS transistors N59 to N63 and inverters IV21 and IV22.

The inverters IV21 and IV22 are connected in parallel in a reverse direction between the node QS and a node QS_N.

The NMOS transistor N596 and the NMOS transistor N60 are connected in series between the second sensing node SO2 and the terminal of the ground power VSS, the NMOS transistor N59 is turned on in response to a transmission signal TRANS, and the NMOS transistor N60 is turned on or turned off according to the potential level of the node QS.

The NMOS transistor N61 is connected between the node QS and a node ND3, and is turned on in response to a reset signal SRST to electrically connect the node QS and the node ND3 to each other. The NMOS transistor N63 is connected between the node ND3 and the terminal of the ground power VSS, and is turned on according to the potential of the second sensing node SO2 to electrically connect the node ND3 and the terminal of the ground power VSS to each other. For example, in a state in which the second sensing node SO2 is precharged to a high level, when the reset signal SRST is applied to the NMOS transistor N61 as a high level, the node QS and the node QS_N are initialized to a low level (0) and a high level (1), respectively. In addition, in a state in which the second sensing node SO2 is precharged to a high level, the set signal SSET is applied to the NMOS transistor N62 as a high level, the node QS and the node QS_N are set to a high level (1) and a low level (0), respectively.

The latch circuit F_LATCH may include a plurality of NMOS transistors N64 to N68 and inverters IV23 and IV24.

The inverters IV23 and IV24 are connected in parallel in a reverse direction between the node QF and a node QF_N.

The NMOS transistor N64 and the NMOS transistor N65 are connected in series between the second sensing node SO2 and the terminal of the ground power VSS, the NMOS transistor N64 is turned on in response to the transmission signal TRANS, and the NMOS transistor N65 is turned on or turned off according to the potential level of the node QS.

The NMOS transistor N66 is connected between the node QF and a node ND4, and is turned on in response to a reset signal FRST to electrically connect the node QF and the node ND4 to each other. The NMOS transistor N67 is connected between a node QF_N and the node ND4, and is turned on in response to a set signal FSET to electrically connect the node QF_N and the node ND4 to each other. The NMOS transistor N66 is connected between the node ND4 and the terminal of the ground power VSS, and is turned on according to the potential of the second sensing node SO2 to electrically connect the node ND4 and the terminal of the ground power VSS to each other. For example, in a state in which the second sensing node SO2 is precharged to a high level, when the reset signal FRST is applied to the NMOS transistor N66 as a high level, the node QF and the node QF_N are initialized to a low level (0) and a high level (1), respectively. In addition, in a state in which the second sensing node SO2 is precharged to a high level, the set signal FSET is applied to the NMOS transistor N68 as a high level, the node QF and the node QF_N are set to a high level (1) and a low level (0), respectively.

The latch circuit D_LATCH may include a plurality of NMOS transistors N69 to N73 and inverters IV25 and IV26.

The inverters IV25 and IV26 are connected in parallel in a reverse direction between a node QD and a node QD_N.

The NMOS transistor N69 and the NMOS transistor N70 are connected in series between the second sensing node SO2 and the terminal of the ground power VSS, the NMOS transistor N69 is turned on in response to a transmission signal TRAND, and the NMOS transistor N70 is turned on or turned off according to a potential level of the node QD.

The NMOS transistor N71 is connected between the node QD and a node ND5, and is turned on in response to a reset signal DRST to electrically connect the node QD and the node ND5 to each other. The NMOS transistor N72 is connected between the node QD_N and the node ND5, and is turned on in response to a set signal DSET to electrically connect the node QD_N and the node ND5 to each other. The NMOS transistor N73 is connected between the node ND5 and the terminal of the ground power VSS, and is turned on according to the potential of the second sensing node SO2 to electrically connect the node ND5 and the terminal of the ground power VSS to each other.

For example, when the NMOS transistor N72 is turned on by applying the set signal DSET of a high level during the program verify operation, the NMOS transistor N73 is turned on or turned off according to the potential level of the second sensing node SO2, which is maintained or changed according to a current amount of the bit line BL1, and thus verify data, which is evaluated on the second sensing node SO2, may be stored in the latch circuit D_LATCH.

The latch circuit M_LATCH may include a plurality of NMOS transistors N74 to N78 and inverters IV27 and IV28.

The inverters IV27 and IV28 are connected in parallel in a reverse direction between a node QM and a node QM_N.

The NMOS transistor N74 and the NMOS transistor N75 are connected in series between the first sensing node SO1 and the terminal of the ground power VSS, the NMOS transistor N74 is turned on in response to a transmission signal TRANM, and the NMOS transistor N75 is turned on or turned off according to a potential level of the node QM.

The NMOS transistor N76 is connected between the node QM and a node ND6, and is turned on in response to a reset signal MRST to electrically connect the node QM and the node ND6 to each other. The NMOS transistor N77 is connected between the node QM_N and the node ND6, and is turned on in response to a set signal MSET to electrically connect the node QM_N and the node ND6 to each other. The NMOS transistor N78 is connected between the node ND6 and the terminal of the ground power VSS, and is turned on according to the potential of the first sensing node SO1 to electrically connect the node ND6 and the terminal of the ground power VSS to each other.

For example, when the NMOS transistor N77 is turned on by applying the set signal MSET of a high level during the program verify operation, the NMOS transistor N78 is turned on or turned off according to the potential level of the first sensing node Sal, which is maintained or changed according to the current amount of the bit line BL1, and thus verify data, which is evaluated on the first sensing node Sal, may be stored in the latch circuit M_LATCH.

Figure 15:
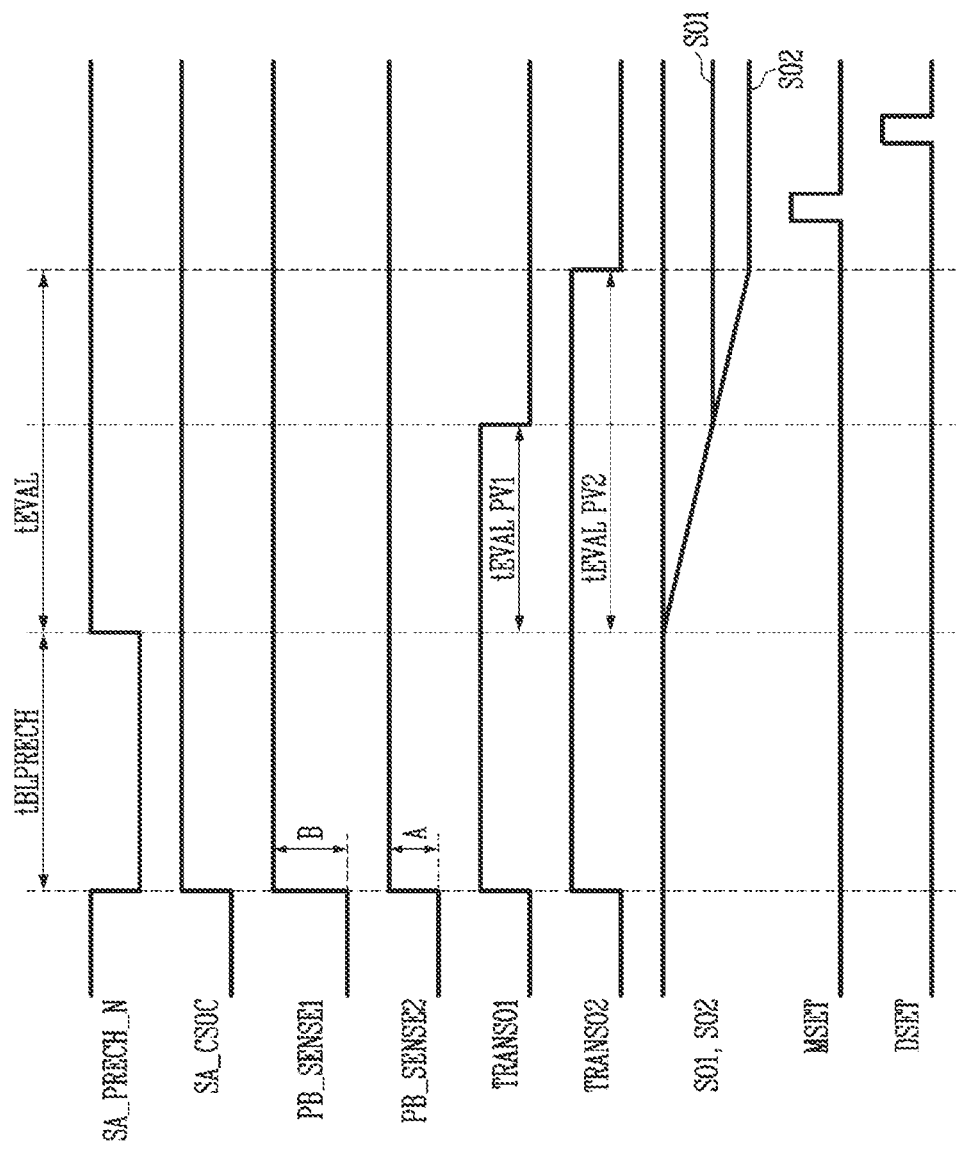
FIG. 15 is a waveform diagram of signals for describing the program verify operation of the page buffer of FIG. 14 according to an embodiment of the present disclosure.

FIG. 15 is a waveform diagram of signals for describing the program verify operation of the page buffer of FIG. 14 according to an embodiment of the present disclosure.

The program verify operation of the page buffer according to another embodiment of the present disclosure will be described with reference to FIGS. 14 and 15 as follows.

In an embodiment of the present disclosure, a method of verifying each of the first program state PV1 and the second program state PV2 by applying the verify voltage $V_{PV2}$ to the selected word line will be described as an example.

When the data to be programmed corresponding to the first program state PV1 is stored in the page buffer PB1 among the plurality of page buffers, the node QS of the latch circuit S_LATCH and the node QF of the latch circuit F_LATCH of the page buffer PB1 are set to a low level.

In a bit line precharge period tBLPRECH, the PMOS transistor P31 is turned on in response to the potential level of the node QS, the PMOS transistor P32 is turned on in response to the precharge signal SA_PRECH_N of a low level, and thus the first and second sensing nodes Sal and SO2 are precharged to a level of the power voltage VDD. The NMOS transistor N55 is turned on in response to the control signal SA_CSOC of a high level, and thus the second common node CSO2 is charged to a VDD−Vth (the threshold voltage of N55) level. The NMOS transistor N53 is turned on in response to the second page buffer sensing signal PB_SENSE2 of an A level to form the current path connecting the second common node CSO2 and the first common node CSO1 to each other, and thus the first common node CSO1 is charged to the potential A of the second page buffer sensing signal PB_SENSE2−Vth (the threshold voltage of N53). Therefore, the bit line BL1 is precharged to the first setting level (PB_SENSE2−Vth).

When the verify voltage $V_{PV2}$ is applied to the selected word line, the memory cell connected to the selected word line among the memory cells connected to the bit line BL1 is turned on when the threshold voltage is higher than the verify voltage $V_{PV1}$ and is turned off when the threshold voltage is lower than the verify voltage $V_{PV1}$. That is, the current amount flowing through the bit line BL1 changes according to the threshold voltage of the memory cell.

Thereafter, in a first evaluation period tEVAL PV1 of an evaluation period tEVAL, the PMOS transistor P32 is turned off in response to the precharge signal SA_PRECH_N of a high level, and the power voltage VDD applied to the second sensing node SO2 is cut off. During the first evaluation period tEVAL PV1 for the program verify operation of the memory cells corresponding to the first program state PV1, the sensing node connection component 133 electrically connects the first sensing node SO1 and the second sensing node SO2 to each other in response to the first transmission signal TRANSO1 and the first inversion transmission signal TRANSO1_N, and thus the evaluation operation is performed on the first sensing node SO1 and the second sensing node SO2 during the first evaluation period tEVAL PV1. Therefore, the potential level of the first sensing node SO1 and the second sensing node SO2 maintain a precharge level or is decreased according to a threshold voltage value of the memory cell connected to the corresponding bit line during the first evaluation period tEVAL PV1.

When the first evaluation period tEVAL PV1 is ended, the sensing node connection component 133 electrically disconnect the first sensing node SO1 and the second sensing node SO2 from each other in response to the first transmission signal TRANSO1 and the first inversion transmission signal TRANSO1_N. Therefore, only the second sensing node SO2 is electrically connected to the bit line BL1 and the evaluation operation is continuously performed. Thus, the potential level of the second sensing node SO2 may maintain the precharge level or may be decreased according to the threshold voltage value of the memory cell connected to the corresponding bit line during a second evaluation period tEVAL PV2 for the program verify operation of the memory cells corresponding to the second program state PV2. That is, when the evaluation operation is performed on the second sensing node SO2 during the second evaluating period tEVAL PV2 longer than the first evaluating period tEVAL PV1, a decrease width of the potential level of the second sensing node SO2 may be greater than that of the first sensing node SO1. That is, the potential level of the second sensing node SO2 may be evaluated to a level lower than that of the first sensing node SO1.

When the second evaluation period tEVAL PV2 is ended, the NMOS transistor N33 is turned off in response to the second transmission signal TRANSO2, and thus the second sensing node SO2 and the common node CSO are disconnected from each other.

The NMOS transistor N78 of the latch circuit M_LATCH is turned on or turned off according to the potential level of the first sensing node SO1. Thereafter, the set signal MSET of a high level may be applied to the NMOS transistor N77, and thus the node QM_N may maintain a high level or transit to a low level to store the verify data corresponding to the first program state PV1.

The NMOS transistor N73 of the latch circuit M_LATCH is turned on or turned off according to the potential level of the second sensing node SO2. Thereafter, the set signal DSET of a high level may be applied to the NMOS transistor N72, and thus the node QD_N may maintain a high level or transit to a low level to store the verify data corresponding to the second program state PV2.

In an embodiment, since the program verify operation is a program verify operation of a case where the page buffer PB1 stores the data to be programmed corresponding to the first program state PV1, the verify operation is performed using verify data sensed by the latch circuit M_LATCH When the data to be programmed corresponding to the second program state PV2 is stored in the page buffer PB1 among the plurality of page buffers, the node QS of the latch circuit S. LATCH of the page buffer PB1 is set to a low level, and the node QF of the latch circuit F_LATCH is set to a high level.

In the bit line precharge period tBLPRECH, the PMOS transistor P31 is turned on in response to the potential level of the node QS, the PMOS transistor P32 is turned on in response to the precharge signal SA_PRECH_N of a low level, and thus the first and second sensing nodes SO1 and SO2 are precharged to the level of the power voltage VDD. The NMOS transistor N55 is turned on in response to the control signal SA_CSOC of a high level, and thus the second common node CSO2 is charged to a VDD−Vth (the threshold voltage of N55) level. The NMOS transistor N53 is turned on in response to the second page buffer sensing signal PB_SENSE2 of the A level to form the current path connecting the second common node CSO2 and the first common node CSO1 to each other, and the NMOS transistor N54 is turned on in response to the potential level of the node QF to form the current path connecting the second common node CSO2 and the first command node CSO1 to each other. At this time, since the potential level of the node QF applied to the gate of the NMOS transistor N54 is higher than the potential level of the second page buffer sensing signal PB_SENSE2, the potential level of the second common node CSO2 is transferred to the first common node CSO1 without a clamping operation. Therefore, the first common node CSO1 is charged to a VDD−Vth (the threshold voltage of N55) level. In addition, the NMOS transistor N52 is turned on in response to the first page buffer sensing signal PB_SELSE1 of a B level higher than A, and thus the bit line BL1 is precharged, the clamping operation is generated by the NMOS transistor N52, and thus the bit line BL1 is precharged to the second setting level (PB_SENSE1−Vth).

When the verify voltage $V_{PV2}$ is applied to the selected word line, the memory cell connected to the selected word line among the memory cells connected to the bit line BL1 is turned on when the threshold voltage is higher than the verify voltage $V_{PV2}$ and is turned off when the threshold voltage is lower than the verify voltage $V_{PV2}$. That is, the current amount flowing through the bit line BL1 changes according to the threshold voltage of the memory cell.

Thereafter, in the first evaluation period tEVAL PV1 of the evaluation period tEVAL, the PMOS transistor P32 is turned off in response to the precharge signal SA_PRECH_N of a high level, and the power voltage VDD applied to the second sensing node SO2 is cut off. During the first evaluation period tEVAL PV1 for the program verify operation of the memory cells corresponding to the first program state PV1, the sensing node connection component 133 electrically connects the first sensing node SO1 and the second sensing node SO2 to each other in response to the first transmission signal TRANSO1 and the first inversion transmission signal TRANSO1_N, and thus the evaluation operation is performed on the first sensing node SO1 and the second sensing node SO2 during the first evaluation period tEVAL PV1. Therefore, the potential level of the first sensing node SO1 and the second sensing node SO2 maintain a precharge level or is decreased according to a threshold voltage value of the memory cell connected to the corresponding bit line during the first evaluation period tEVAL PV1.

When the first evaluation period tEVAL PV1 is ended, the sensing node connection component 133 electrically disconnect the first sensing node SO1 and the second sensing node SO2 from each other in response to the first transmission signal TRANSO1 and the first inversion transmission signal TRANSO1_N. Therefore, only the second sensing node SO2 is electrically connected to the bit line BL1 and the evaluation operation is continuously performed. Thus, the potential level of the second sensing node SO2 may maintain the precharge level or may be decreased according to the threshold voltage value of the memory cell connected to the corresponding bit line during the second evaluation period tEVAL PV2 for the program verify operation of the memory cells corresponding to the second program state PV2. That is, when the evaluation operation is performed on the second sensing node SO2 during the second evaluating period tEVAL PV2 longer than the first evaluating period tEVAL PV1, a decrease width of the potential level of the second sensing node SO2 may be greater than that of the first sensing node SO1. That is, the potential level of the second sensing node SO2 may be evaluated to a level lower than that of the first sensing node SO1.

When the second evaluation period tEVAL PV2 is ended, the NMOS transistor N33 is turned off in response to the second transmission signal TRANSO2, and thus the second sensing node SO2 and the second common node CSO2 are disconnected from each other.

The NMOS transistor N78 of the latch circuit M_LATCH is turned on or turned off according to the potential level of the first sensing node SO1. Thereafter, the set signal MSET of a high level may be applied to the NMOS transistor N77, and thus the node QM_N may maintain a high level or transit to a low level to store the verify data corresponding to the first program state PV1.

The NMOS transistor N73 of the latch circuit D_LATCH is turned on or turned off according to the potential level of the second sensing node SO2. Thereafter, the set signal DSET of a high level may be applied to the NMOS transistor N72, and thus the node QD_N may maintain a high level or transit to a low level to store the verify data corresponding to the second program state PV2.

In an embodiment, since the program verify operation is a program verify operation of a case where the page buffer PB1 stores the data to be programmed corresponding to the second program state PV1, the verify operation is performed using verify data sensed by the latch circuit D_LATCH.

Table 2 is a table illustrating a set state of the nodes QS and QF of the latch circuits and the precharge levels of the first and second common nodes CSO1 and CSO2 and the bit line BL during the program verify operation using one verify voltage.

In Table 2, the lower program state and the higher program state indicate a lower program state in which a threshold voltage distribution is low and a higher program state in which the threshold voltage distribution is high among two program states for program verify using one verify voltage. For example, during the program verify operation using the verify voltage $V_{PV2}$, the lower program state is the first program state PV1, the higher program state is the second program state PV2, and the remaining program states are the third program state to the fifteenth program state PV3 to PV15.

As described above, according to another embodiment of the present disclosure, during the program verify operation, the bit line is precharged to different precharge levels according to the program state, and the evaluation period reflecting the current amount of the bit line to the potential level of the sensing node is divided according to the program state. That is, accuracy of the program verify operation may be further improved by setting the evaluation period during the program verify operation of the program state in which the threshold voltage distribution is low to be short and setting the evaluation period during the program verify operation of the program state in which the threshold voltage distribution is high to be long to improve a cell current different between the program states. In addition, sensing nodes respectively corresponding to the program states are disconnected from each other, and the evaluation operation is performed on the sensing nodes during different evaluation periods. The evaluation periods may overlap with each other and thus an operation time may be reduced.

Figure 16:
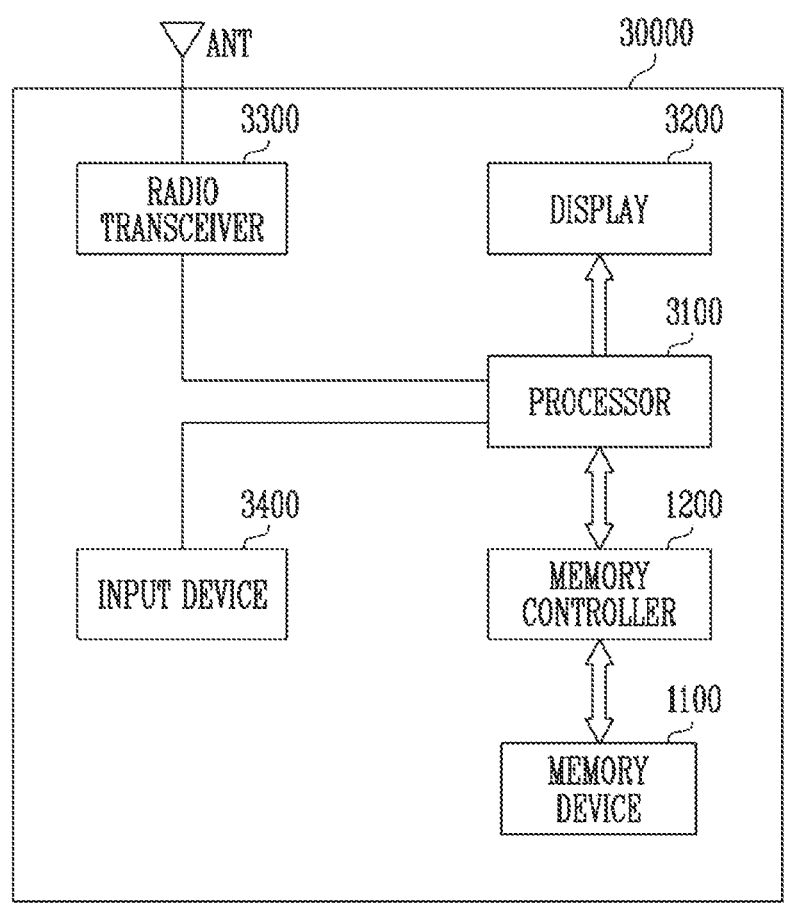
FIG. 16 is a diagram for describing another embodiment of the memory system.

FIG. 16 is a diagram for describing another embodiment of the memory system.

Referring to FIG. 16, a memory system 30000 may be implemented as a cellular phone, a smart phone, a tablet PC, a personal digital assistant (PDA) or a wireless communication device. The memory system 30000 may include the memory device 1100 and the controller 1200 capable of controlling the operation of the memory device 1100. The controller 1200 may control a data access operation, for example, a program operation, an erase operation, or a read operation, of the memory device 1100 under control of a processor 3100.

Data programmed in the memory device 1100 may be output through a display 3200 under the control of the memory controller 1200.

A radio transceiver 3300 may transmit and receive a radio signal through an antenna ANT. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the memory controller 1200 or the display 3200. The memory controller 1200 may program the signal processed by the processor 3100 to the memory device 1100. In addition, the radio transceiver 3300 may convert a signal output from the processor 3100 into a radio signal, and output the converted radio signal to an external device through the antenna ANT. An input device 3400 may be a device capable of inputting a control signal for controlling the operation of the processor 3100 or data to be processed by the processor 3100. The input device 3400 may be implemented as a pointing device such as a touch

TABLE 2

|      | Lower program state | Higher program state | Remaining program states |
|------|---------------------|----------------------|--------------------------|
| QS   | 0(low level)        | 0(low level)         | 1(high level)            |
| QF   | 0(low level)        | 1(high level)        | 0(low level)             |
| CSO2 | VDD − Vth           | VDD − Vth            | GND(VSS)                 |
| CSO1 | PB_SENSE2 − Vth     | VDD − Vth            | GND(VSS)                 |
| BL   | PB_SENSE2 − Vth     | PB_SENSE1 − Vth      | GND(VSS)                 | pad or a computer mouse, a keypad, or a keyboard. The processor 3100 may control an operation of the display 3200 so that data output from the controller 1200, data output from the radio transceiver 3300, or data output from the input device 3400 is output through the display 3200.

According to an embodiment, the memory controller 1200 capable of controlling the operation of memory device 1100 may be implemented as a part of the processor 3100 and may also be implemented as a chip separate from the processor 3100. In addition, the memory controller 1200 may be implemented through the example of the controller 1200 shown in FIG. 1.

Figure 17:
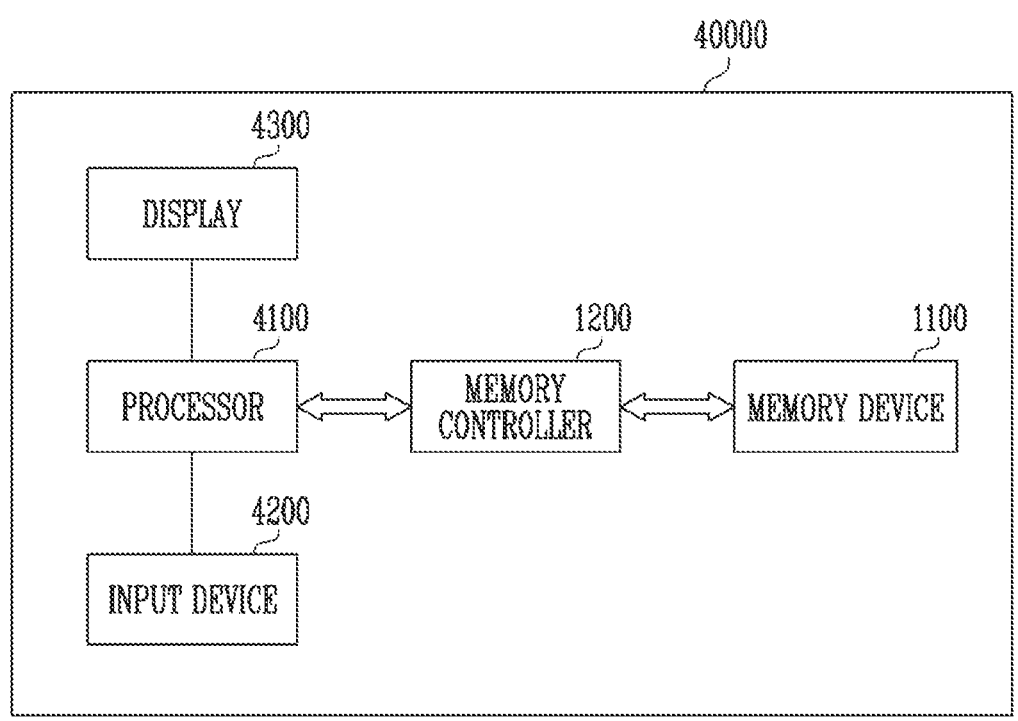
FIG. 17 is a diagram for describing another embodiment of the memory system.

FIG. 17 is a diagram for describing another example of the memory system.

Referring to FIG. 17, a memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 capable of controlling a data process operation of the storage device 1100.

A processor 4100 may output data stored in the memory device 1100 through a display 4300, according to data input through an input device 4200. For example, the input device 4200 may be implemented as a point device such as a touch pad or a computer mouse, a keypad, or a keyboard.

The processor 4100 may control the overall operation of the memory system 40000 and control the operation of the memory controller 1200. According to an embodiment, the memory controller 1200 capable of controlling the operation of memory device 1100 may be implemented as a part of the processor 4100 or may be implemented as a chip separate from the processor 4100. In addition, the memory controller 1200 may be implemented through the example of the controller 1200 shown in FIG. 1.

Figure 18:
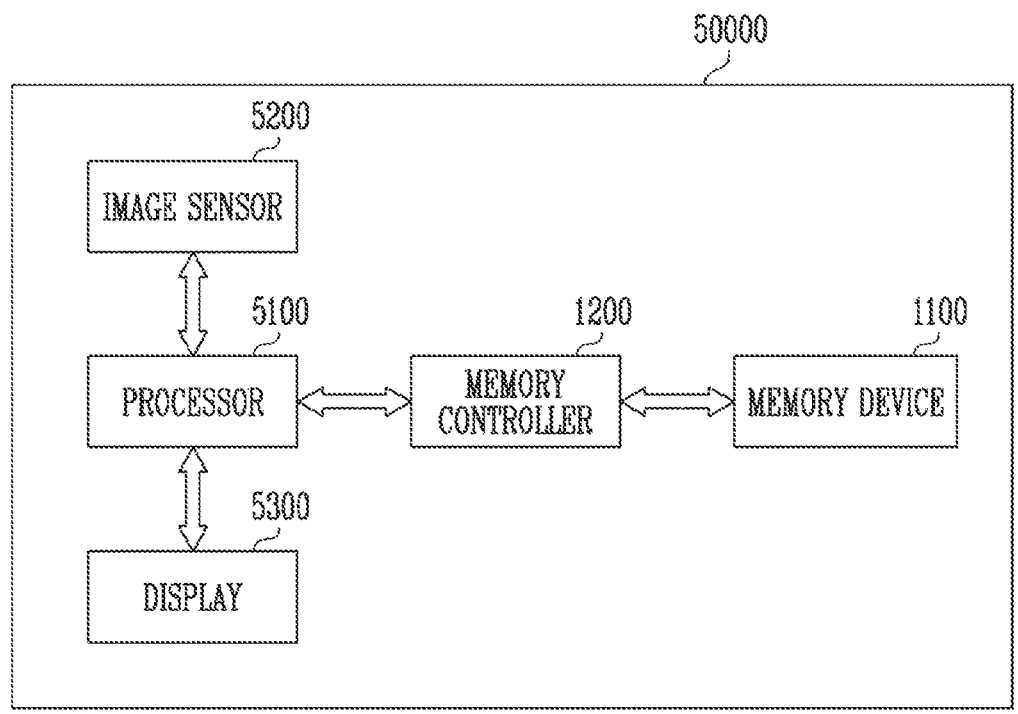
FIG. 18 is a diagram for describing another embodiment of the memory system.

FIG. 18 is a diagram for describing another embodiment of the memory system.

Referring to FIG. 18, a memory system 50000 may be implemented as an image processing device, for example, a digital camera, a portable phone provided with a digital camera, a smart phone provided with a digital camera, or a tablet PC provided with a digital camera.

The memory system 50000 includes the memory device 1100 and the memory controller 1200 capable of controlling a data process operation, for example, a program operation, an erase operation, or a read operation, of the memory device 1100.

An image sensor 5200 of the memory system 50000 may convert an optical image into digital signals. The converted digital signals may be transmitted to a processor 5100 or the memory controller 1200. Under control of the processor 5100, the converted digital signals may be output through a display 5300 or stored in the memory device 1100 through the controller 1200. In addition, data stored in the memory device 1100 may be output through the display 5300 under the control of the processor 5100 or the memory controller 1200.

According to an embodiment, the memory controller 1200 capable of controlling the operation of memory device 1100 may be implemented as a part of the processor 5100 or may be implemented as a chip separate from the processor 5100. In addition, the memory controller 1200 may be implemented through the example of the controller 200 shown in FIG. 1.

Figure 19:
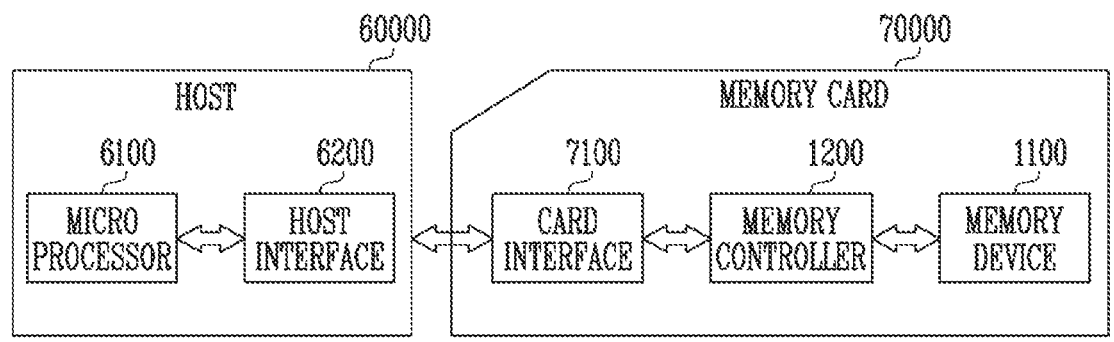
FIG. 19 is a diagram for describing another embodiment of the memory system.

FIG. 19 is a diagram for describing another embodiment of the memory system.

Referring to FIG. 19, a memory system 70000 may be implemented as a memory card or a smart card. The memory system 70000 may include the memory device 1100, the memory controller 1200, and a card interface 7100.

The memory controller 1200 may control data exchange between the memory device 1100 and the card interface 7100. According to an embodiment, the card interface 7100 may be a secure digital (SD) card interface or a multi-media card (MMC) interface, but is not limited thereto. In addition, the memory controller 1200 may be implemented through the example of the controller 1200 shown in FIG. 1.

The card interface 7100 may interface data exchange between a host 60000 and the controller 1200 according to a protocol of the host 60000. According to an embodiment, the card interface 7100 may support a universal serial bus (USB) protocol, and an interchip (IC)-USB protocol. Here, the card interface may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the interface 6200 may perform data communication with the memory device 1100 through the card interface 7100 and the memory controller 1200 under control of a microprocessor 6100.

Although the present disclosure has been described with reference to some embodiments and drawings, the present disclosure is not limited to the embodiments described above, and various changes and modifications may be made from the disclosed description by those skilled in the art to which the present disclosure pertains.

What is claimed is:

1. A page buffer comprising:
   a first latch circuit configured to store data corresponding to one of a first program state and a second program state;
   a bit line controller connected to a bit line of a memory block and configured to precharge the bit line by applying one of a first set voltage and a second set voltage to the bit line according to the data stored in the first latch circuit during a bit line precharge operation in a program verify operation; and
   a second latch circuit connected to the bit line controller through a main sensing node and configured to sense first verify data according to a potential level of the main sensing node during the program verify operation.

2. The page buffer of claim 1, wherein the first program state and the second program state are program states in which threshold voltage distributions are adjacent to each other among a plurality of program states.

3. The page buffer of claim 2, wherein if the data stored in the first latch circuit corresponds to the first program state, the bit line controller precharges the bit line to the first set voltage, and
   wherein, if the data stored in the first latch circuit corresponds to the second program state, the page buffer precharges the bit line to the second set voltage of which a potential level is higher than a potential level of the first set voltage.

4. The page buffer of claim 3, wherein a threshold voltage distribution of the first program state is lower than a threshold voltage distribution of the second program state.

5. The page buffer of claim 3, wherein the bit line controller comprises:
a first transistor connected between the bit line and a first common node, and configured to connect the bit line and the first common node to each other in response to a first page buffer sensing signal;
a second transistor connected between the first common node and a second common node, and configured to form a first current path by connecting the first common node and the second common node to each other in response to a second page buffer sensing signal;
a third transistor connected between the first common node and the second common node, and configured to form a second current path by connecting the first common node and the second common node to each other in response to a first node potential of the first latch circuit; and
a fourth transistor connected to the second common node and configured to apply a power voltage to the second common node in response to a control signal.

6. The page buffer of claim 5, wherein the first page buffer sensing signal is activated to a first level and the second page buffer sensing signal is activated to a second level during the bit line precharge operation, and
wherein the second level is lower than the first level.

7. The page buffer of claim 6, wherein if the data corresponding to the first program state is stored in the first latch circuit, the first node potential is set to a third level, if the data corresponding to the second program state is stored in the first latch circuit, the first node potential is set to a fourth level, and
wherein the third level is a ground power level, and the fourth level is a power voltage level.

8. The page buffer of claim 7, wherein the fourth level is higher than the second level.

9. The page buffer of claim 5, wherein the bit line controller further includes a fifth transistor connected between the second common node and the main sensing node and electrically connecting the second common node and the main sensing node to each other in response to a transmission signal, and
wherein the fifth transistor performs an evaluation operation of controlling a potential level of the main sensing node according to a current amount of the bit line by connecting the second common node and the main sensing node to each other in an evaluation operation after the bit line precharge operation.

10. The page buffer of claim 1, further comprising:
a sensing node connection component connected between the main sensing node and a sub sensing node; and
a third latch circuit connected to the sub sensing node and configured to sense second verify data according to a potential level of the sub sensing node during the program verify operation.

11. The page buffer of claim 10, wherein the first verify data corresponds to a program verify result for the second program state, and
the second verify data corresponds to a program verify result for the first program state.

12. The page buffer of claim 10, wherein the main sensing node and the sub sensing node perform an evaluation operation through the bit line controller after the bit line precharge operation, and
wherein the sensing node connection component electrically connects the main sensing node and the sub sensing node to each other during a first period during the evaluation operation, and electrically disconnect the main sensing node and the sub sensing node from each other during a second period after the first period.

13. The page buffer of claim 12, wherein the evaluation operation is performed on the main sensing node during the first period and the second period, and
wherein the evaluation operation is performed on the sub sensing node during the first period.

14. The page buffer of claim 13, wherein the evaluation operation corresponding to the second program state is performed on the main sensing node, and
wherein the evaluation operation corresponding to the first program state is performed on the sub sensing node.

* * * * *